(12) United States Patent
Liaw

(10) Patent No.: US 11,600,624 B2
(45) Date of Patent: Mar. 7, 2023

(54) SEMICONDUCTOR STRUCTURE WITH DIELECTRIC FIN IN MEMORY CELL AND METHOD FOR FORMING THE SAME

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/521,389

(22) Filed: Nov. 8, 2021

(65) Prior Publication Data
US 2022/0059548 A1 Feb. 24, 2022

Related U.S. Application Data

(63) Continuation of application No. 16/589,273, filed on Oct. 1, 2019, now Pat. No. 11,171,143.

(51) Int. Cl.
| | |
|---|---|
| H01L 27/11 | (2006.01) |
| H01L 27/092 | (2006.01) |
| H01L 29/66 | (2006.01) |
| H01L 21/8238 | (2006.01) |

(52) U.S. Cl.
CPC .. *H01L 27/1104* (2013.01); *H01L 21/823821* (2013.01); *H01L 21/823878* (2013.01); *H01L 27/0924* (2013.01); *H01L 29/66545* (2013.01)

(58) Field of Classification Search
CPC ......... H01L 27/1104; H01L 21/823821; H01L 27/0924; H01L 29/66545; H01L 21/823878
See application file for complete search history.

(56) References Cited

U.S. PATENT DOCUMENTS

| | | | |
|---|---|---|---|
| 9,455,331 B1* | 9/2016 | Cai | ........................ H01L 29/785 |
| 2013/0154027 A1 | 6/2013 | Liaw | |
| 2014/0131813 A1 | 5/2014 | Liaw | |
| 2017/0098648 A1* | 4/2017 | Lee | ..................... H01L 29/7848 |
| 2018/0138092 A1 | 5/2018 | Lee et al. | |
| 2018/0138185 A1 | 5/2018 | Hsu et al. | |

\* cited by examiner

*Primary Examiner* — Karen Kusumakar
*Assistant Examiner* — Adam S Bowen
(74) *Attorney, Agent, or Firm* — McClure, Qualey & Rodack, LLP

(57) ABSTRACT

A semiconductor structure is provided. The semiconductor structure includes a first dielectric fin, a first semiconductor fin and a second dielectric fin over a substrate. The first semiconductor fin interposes between and is spaced apart from the first dielectric fin and the second dielectric fin. The semiconductor structure also includes a first source/drain structure over a source/drain portion of the first semiconductor fin, an inter-layer dielectric layer covering a first portion of an upper surface of the first source/drain structure and an upper surface of the second dielectric fin, and a first contact in the inter-layer dielectric layer and covering a second portion of the upper surface of the first source/drain structure and an upper surface of the first dielectric fin.

20 Claims, 21 Drawing Sheets

SEMICONDUCTOR STRUCTURE WITH DIELECTRIC FIN IN MEMORY CELL AND METHOD FOR FORMING THE SAME

PRIORITY CLAIM

This application is a Continuation Application of U.S. application Ser. No. 16/589,273, filed on Oct. 1, 2019, entitled "SEMICONDUCTOR STRUCTURE WITH DIELECTRIC FIN IN MEMORY CELL AND METHOD FOR FORMING THE SAME," the entire of which is incorporated by reference herein.

BACKGROUND

Integrated circuits (ICs) have become increasingly important. Applications using ICs are used by millions of people. These applications include cell phones, smartphones, tablets, laptops, notebook computers, PDAs, wireless email terminals, MP3 audio and video players, and portable wireless web browsers. Integrated circuits increasingly include powerful and efficient on-board data storage and logic circuitry for signal control and processing.

The recent trend in miniaturizing ICs has resulted in smaller devices which consume less power, yet provide more functionality at higher speeds than before. The miniaturization process has also resulted in various developments in IC designs and/or manufacturing processes to ensure the desired production yield and the intended performance.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
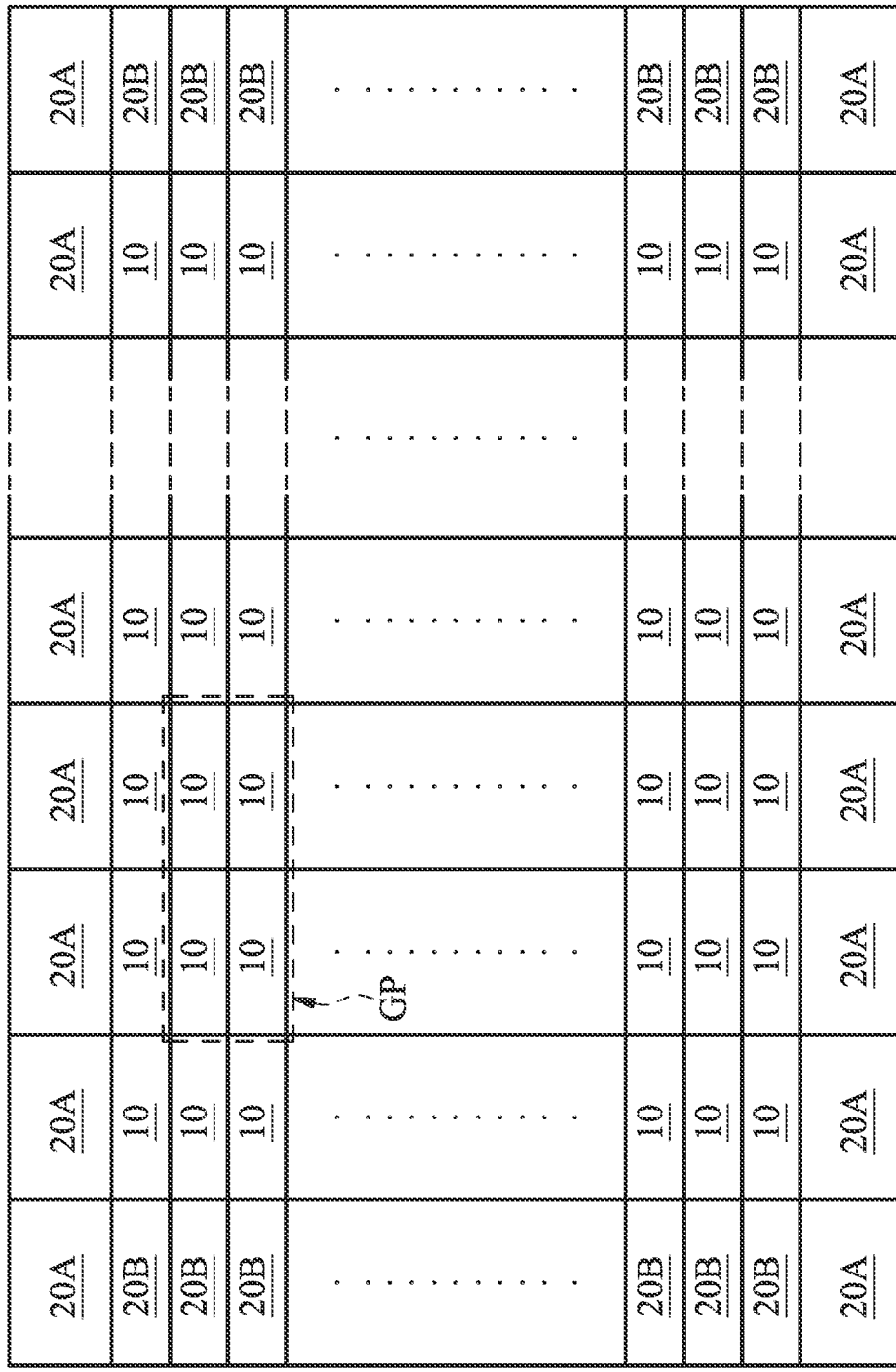
FIG. 1 illustrates a simplified diagram of a static random access memory (SRAM), in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) including static random access memory (SRAM) structures are provided in accordance with various exemplary embodiments. Some variations of some embodiments are discussed. Throughout the various views and illustrative embodiments, like reference numbers are used to designate like elements.

Embodiments of a semiconductor structure are provided. The semiconductor structure includes first and second P-type well regions, an N-type well region and an SRAM cell over a substrate. The N-type well region is between the first and the second P-type well regions. The SRAM cell includes first and second pull-up transistors over the N-type well region, a first pull-down transistor over the second P-type well region, and a second pull-down transistor over the first P-type well region. The first pull-up transistor, the second pull-up transistor, the first pull-down transistor and the second pull-down transistor respectively includes a first fin, a second fin, a third fin and a fourth fin. The semiconductor structure also includes a first dielectric fin between the second and the fourth fins, a second dielectric fin between the first and the second fins, and a third dielectric fin between the first and the third fins. By disposing the above-mentioned dielectric fins (i.e., dummy fins) between adjacent fins (i.e., active fins), the undesirable bridge problem between S/D structures can be prevented while the sizes of the S/D structures reach their maximum values.

FIG. 1 illustrates a simplified diagram of an SRAM 30, in accordance with some embodiments of the disclosure. The SRAM 30 can be an independent device or be implemented in an IC (e.g. System-on-Chip (SOC)). The SRAM 30 includes a cell array formed by multiple SRAM cells (or called bit cells) 10, and the SRAM cells 10 are arranged in multiple rows and multiple columns in the cell array.

In the fabrication of SRAM cells, the cell array may be surrounded by multiple strap cells 20A and multiple edge cells 20B, and the strap cells 20A and the edge cells 20B are dummy cells for the cell array. In some embodiments, the strap cells 20A are arranged to surround the cell array horizontally, and the edge cells 20B are arranged to surround the cell array vertically. The shapes and sizes of the strap cells 20A and the edge cells 20B are determined according to actual application.

In some embodiments, the shapes and sizes of the strap cells 20A and the edge cells 20B are the same as the SRAM cells 10. In some embodiments, the shapes and sizes of the strap cells 20A, the edge cells 20B and the SRAM cells 10 are different. Moreover, in the SRAM 30, each SRAM cell 10 has the same rectangular shape/region, e.g., the widths and heights of the SRAM cells 10 are the same. The configurations of the SRAM cells 10 are described below.

In the cell array of the SRAM 30, although only one group GP is shown in FIG. 1, the SRAM cells 10 can be divided into multiple groups GP, and each of the groups GP includes four adjacent SRAM cells 10. The groups GP will be described in detail below.

Figure 2A:
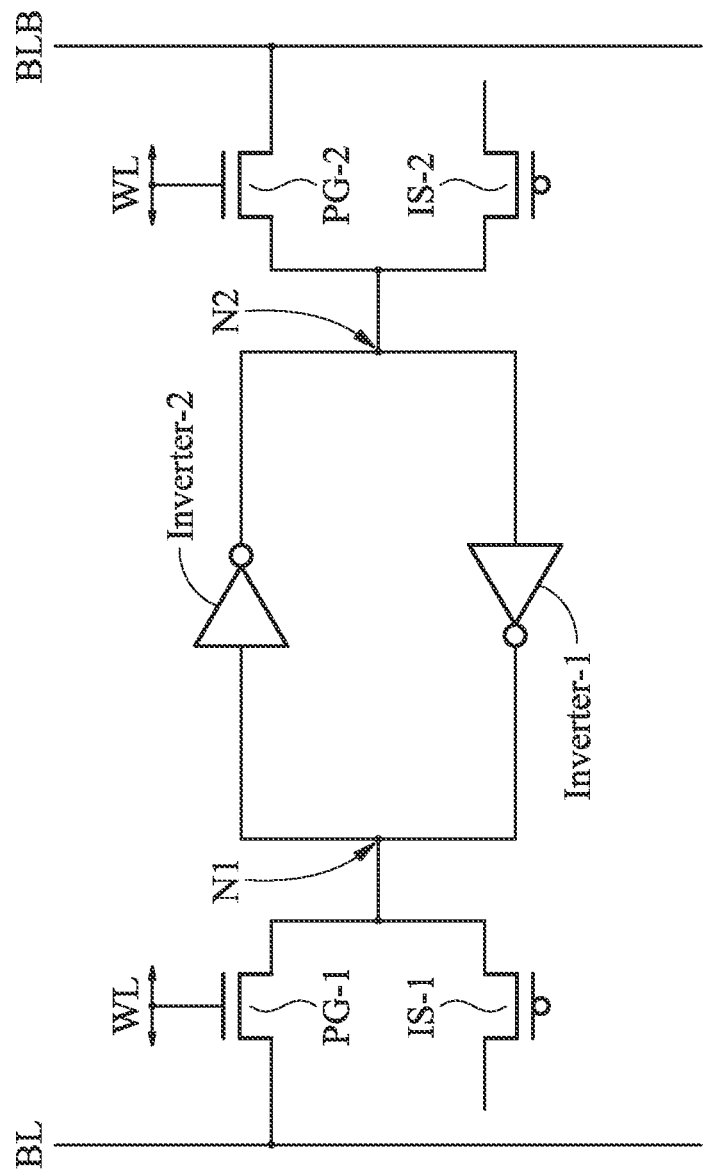
FIG. 2A illustrates a single-port SRAM cell, in accordance with some embodiments of the disclosure.

FIG. 2A illustrates a single-port SRAM cell 10, in accordance with some embodiments of the disclosure. The SRAM cell 10 includes a pair of cross-coupled inverters Inverter-1 and Inverter-2, two pass-gate transistors PG-1 and PG-2, and two isolation transistors IS-1 and IS-2. The inverters Inverter-1 and Inverter-2 are cross-coupled between the nodes N1 and N2, and form a latch.

The pass-gate transistor PG-1 is coupled between a bit line BL and the node N1, and the pass-gate transistor PG-2 is coupled between a complementary bit line BLB and the node N2, wherein the complementary bit line BLB is complementary to the bit line BL. The gates of the pass-gate transistors PG-1 and PG-2 are coupled to the same word-line WL. The isolation transistors IS-1 and IS-2 may have a negligible effect on the operation of the SRAM cell 10, since no current will flow away from the nodes N1 and N2 through the isolation transistors IS-1 or IS-2. Furthermore, the pass-gate transistors PG-1 and PG-2 may be NMOS transistors, and the isolation transistors IS-1 and IS-2 may be PMOS transistors.

Figure 2B:
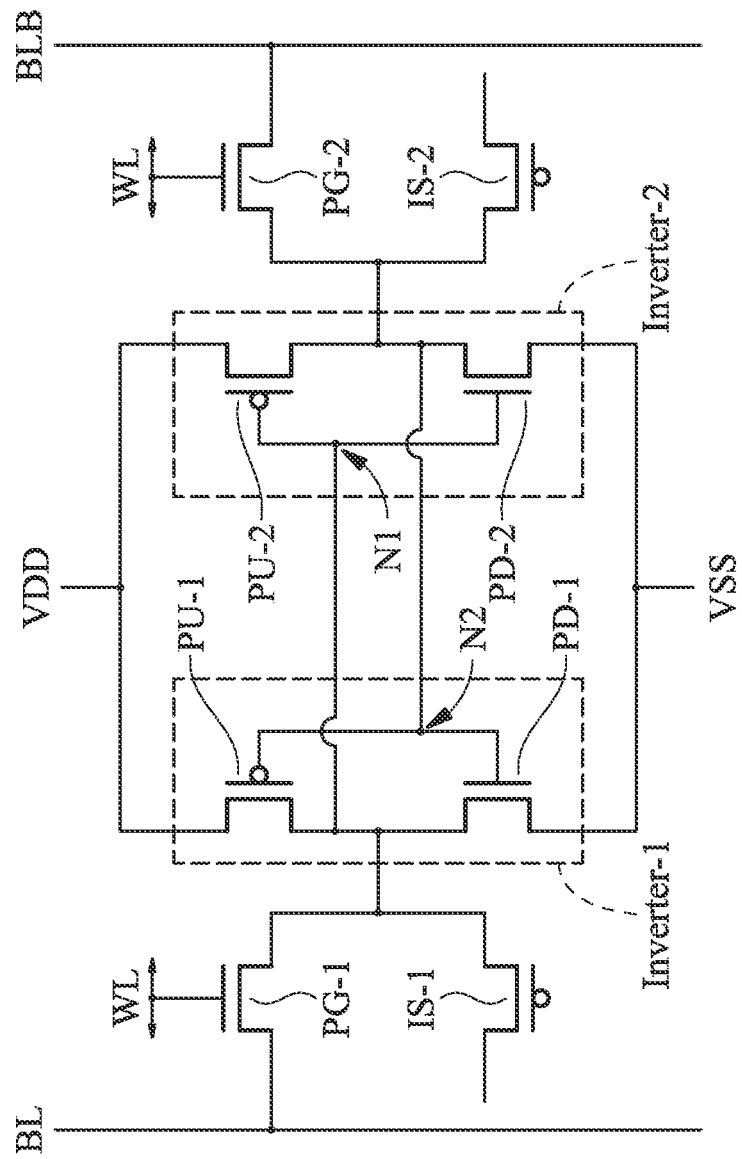
FIG. 2B illustrates an alternative illustration of the SRAM cell of FIG. 2A, in accordance with some embodiments of the disclosure.

FIG. 2B illustrates an alternative illustration of the SRAM cell of FIG. 2A, in accordance with some embodiments of the disclosure. The inverter Inverter-1 in FIG. 2A includes a pull-up transistor PU-1 and a pull-down transistor PD-1, as shown in FIG. 2B. The pull-up transistor PU-1 is a PMOS transistor, and the pull-down transistor PD-1 is an NMOS transistor. The drain of the pull-up transistor PU-1 and the drain of the pull-down transistor PD-1 are coupled to the node N1 connecting the pass-gate transistor PG-1. The gates of the pull-up transistor PU-1 and the pull-down transistor PD-1 are coupled to the node N2 connecting the pass-gate transistor PG-2. Furthermore, the source of the pull-up transistor PU-1 is coupled to a power supply node VDD, and the source of the pull-down transistor PD-1 is coupled to a ground VSS.

Similarly, the inverter Inverter-2 in FIG. 2A includes a pull-up transistor PU-2 and a pull-down transistor PD-2, as shown in FIG. 2B. The pull-up transistor PU-2 is a PMOS transistor, and the pull-down transistor PD-2 is an NMOS transistor. The drains of the pull-up transistor PU-2 and the pull-down transistor PD-2 are coupled to the node N2 connecting the pass-gate transistor PG-2. The gates of the pull-up transistor PU-2 and the pull-down transistor PD-2 are coupled to the node N1 connecting the pass gate transistor PG-1. Furthermore, the source of the pull-up transistor PU-2 is coupled to the power supply node VDD, and the source of the pull-down transistor PD-2 is coupled to the ground VSS.

In some embodiments, the pass-gate transistors PG-1 and PG-2, the isolation transistors IS-1 and IS-2, the pull-up transistors PU-1 and PU-2, and the pull-down transistors PD-1 and PD-2 of the SRAM cell 10 are fin field effect transistors (FinFETs).

In some embodiments, the pass-gate transistors PG-1 and PG-2, the isolation transistors IS-1 and IS-2, the pull-up transistors PU-1 and PU-2, and the pull-down transistors PD-1 and PD-2 of the SRAM cell 10 are planar MOS devices.

Figure 3:
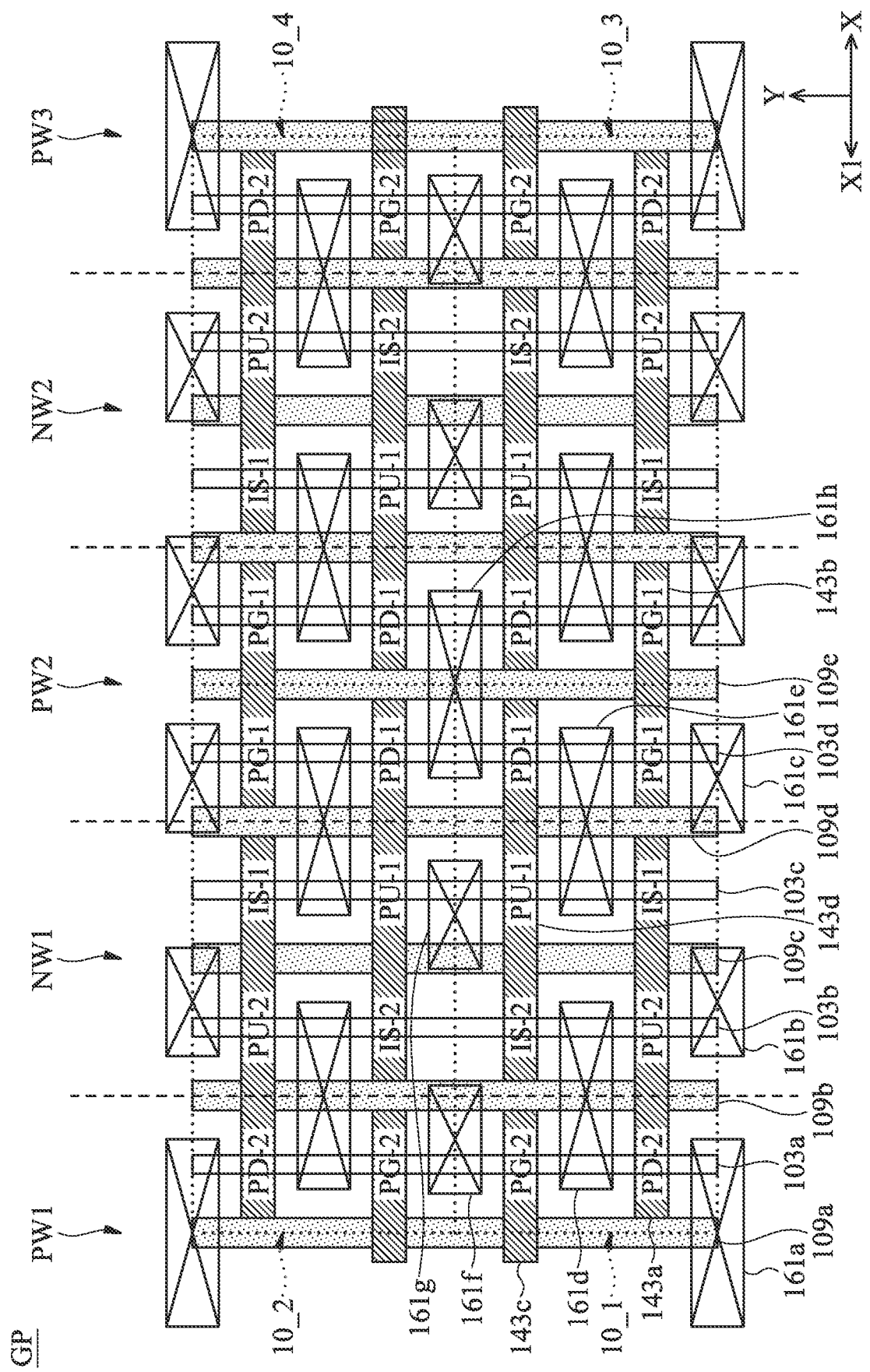
FIG. 3 illustrates a layout showing a group GP of the SRAM in FIG. 1, in accordance with some embodiments of the disclosure.

FIG. 3 illustrates a layout showing a group GP of the SRAM 30 in FIG. 1, in accordance with some embodiments of the disclosure. The group GP includes four SRAM cells 10_1, 10_2, 10_3 and 10_4. In some embodiments, the transistors within the SRAM cells 10_1, 10_2, 10_3 and 10_4 are FinFETs in the N-type well regions NW1 and NW2, and in the P-type well regions PW1, PW2 and PW3. The N-type well region NW1 is formed between and adjacent to the P-type well regions PW1 and PW2, and the N-type well region NW2 is formed between and adjacent to the P-type well regions PW2 and PW3.

The two adjacent SRAM cells 10_1 and 10_3 are arranged in the same row of the cell array of the SRAM 30. The two adjacent SRAM cells 10_1 and 10_2 are arranged in the same column of the cell array of the SRAM 30. The two adjacent SRAM cells 10_3 and 10_4 are arranged in the same column of the cell array of the SRAM 30. In other words, the two adjacent SRAM cells 10_2 and 10_4 are arranged in the same row of the cell array of the SRAM 30. In FIG. 3, each of the SRAM cells 10_1, 10_2, 10_3 and 10_4 has the same rectangular shape/region with a width along the X-direction and a height along the Y-direction, and the height is less than the width. It should be noted that the SRAM structure shown in FIG. 3 is merely an example and is not intended to limit the SRAM cells 10 of the SRAM 30.

In the SRAM 30, the fins (i.e., semiconductor fins) may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the semiconductor fin structures.

In the SRAM cell 10_1, the pass-gate transistor PG-1 is formed at the cross point of the fin 103d and the gate electrode 143b on the P-type well region PW2. The pull-down transistor PD-1 is formed at the cross point of the fin 103d and the gate electrode 143d on the P-type well region PW2. The pass-gate transistor PG-2 is formed at the cross point of the fin 103a and the gate electrode 143c on the P-type well region PW1. The pull-down transistor PD-2 is formed at the cross point of the fin 103a and the gate electrode 143a on the P-type well region PW1.

Moreover, in the SRAM cell 10_1, the pull-up transistor PU-1 is formed at the cross point of the fin structure 103c and the gate electrode 143d on the N-type well region NW1. The pull-up transistor PU-2 is formed at the cross point of the fin 103b and the gate electrode 143a on the N-type well region NW1. The isolation transistor IS-1 is formed at the cross point of the fin structure 103c and the gate electrode 143a on the N-type well region NW1. The isolation transistor IS-2 is formed at the cross point of the fin 103b and the gate electrode 143d on the N-type well region NW1.

Various contacts and their corresponding interconnect vias may be employed to electrically connect components in each SRAM cells 10_1 through 10_4. A bit line (BL) (not shown) may be electrically connected to the source of the pass-gate transistor PG-1 through a contact 161c, and a complementary bit line (BLB) (not shown) may be electrically connected to the source of the pass-gate transistor PG-2 through a contact 161f. Likewise, a contact and/or via of a word line (WL) (not shown) may be electrically connected to the gate electrode 143b of the pass-gate transistor PG-1, and another contact and/or via of the word line (not shown) may be electrically connected to the gate electrode 143c of the pass-gate transistor PG-2.

Moreover, a contact and/or via of the power supply node VDD (not shown) may be electrically connected to the source of the pull-up transistor PU-1 through a contact 161g, and another contact and/or via of the power supply node VDD (not shown) may be electrically connected to the source of the pull-up transistor PU-2 through a contact 161b. A contact and/or via of the ground VSS (not shown) may be electrically connected to the source of the pull-down transistor PD-1 through a contact 161h, and another contact and/or via of the ground VSS (not shown) may be electrically connected to the source of the pull-down transistor PD-2 through a contact 161a.

In addition, a contact 161e is configured to electrically connect the drain of the pull-up transistor PU-1 and the drain of the pull-down transistor PD-1, and a contact 161d is configured to electrically connect the drain of the pull-up transistor PU-2 and the pull-down transistor PD-2.

As shown in FIG. 3, the X1-direction is opposite to the X-direction, and the Y-direction is perpendicular to the X-direction and the X1-direction. In some embodiments, the gate electrode 143a is shared by the pull-down transistor PD-2, the pull-up transistor PU-2 and the isolation transistor IS-1 of the SRAM cell 10_1, the gate electrode 143b is shared by the pass-gate transistors PG-1 of the SRAM cells 10_1 and 10_3, the gate electrode 143c is shared by the pass-gate transistors PG-2 of the SRAM cell 10_1 and another adjacent SRAM cell (not shown) arranged along the X1 direction from the SRAM cell 10_1, and the gate electrode 143d is shared by the pull-down transistor PD-1, the pull-up transistor PU-1 and the isolation transistor IS-2 of the SRAM cell 10_1.

It should be noted that the SRAM cell 10_1 includes a plurality of dielectric fins (e.g., dielectric fins 109a, 109b, 109c, 109d and 109e), and each of the dielectric fins is located between adjacent pairs of fins (e.g., the fins 103a, 103b, 103c and 103d), as shown in FIG. 3 in accordance with some embodiments. The dielectric fin 109a is between the fin 103a within the SRAM cell 10_1 and another fin within the SRAM cell, which is arranged along the X1 direction from the SRAM cell 10_1. That is, the dielectric fin 109a is located at a boundary (or junction, interface) between the SRAM cell 10_1 and the above-mentioned SRAM cell (i.e., shared by adjacent SRAM cells).

In some embodiments, the dielectric fin 109b is between the fins 103a and 103b, the dielectric fin 109c is between the fins 103b and 103c, and the dielectric fin 109d is between the fins 103c and the 103d. In some embodiments, the dielectric fin 109b is located at the boundary between the P-type well region PW1 and the N-type well region NW1, the dielectric fin 109c is located within the N-type well region NW1, and the dielectric fin 109d is located at the boundary between the N-type well region NW1 and the P-type well region PW2. In addition, similar to the dielectric fin 109a, the dielectric fin 109e is located at a boundary between the SRAM cell 10_1 and the SRAM cell 10_3 (i.e., shared by the SRAM cells 10_1 and 10_3).

In some embodiments, the SRAM cell 10_2 is a duplicate cell for the SRAM cell 10_1 but flipped over the X-axis, the SRAM cell 10_3 is a duplicate cell for the SRAM cell 10_1 but flipped over the Y-axis, and the SRAM cell 10_4 is a duplicate cell for the SRAM cell 10_3 but flipped over the X-axis. The common contacts (e.g., the contact 161h electrically connected the sources of the pull-down transistors PD-1 in the SRAM cells 10_1 to 10_4 and the ground VSS), are combined to save space.

As the feature sizes continue to decrease, the adjacent source/drain (S/D) structures of different transistors may be connected during the epitaxial process, which cause undesirable bridge problem. In some embodiments, the dielectric fins (e.g., dielectric fins 109a to 109e) formed between adjacent fins (e.g., fins 103a to 103d) are used to handle the bridge concern of the S/D structures. The S/D structures formed over the fins can be grown in the regions confined by the dielectric fins, allowing the S/D structures to contact the dielectric fins. Therefore, the undesirable bridge problem can be prevented while the sizes of the S/D structures reach their maximum values. As a result, the contact resistance between the S/D structures and the contacts (e.g., the contacts 161a to 161h) overlying the S/D structures may be reduced, and the performance and the operation speeds of the transistors in the group GP of the SRAM 30 may be enhanced.

FIGS. 4A to 4J illustrate perspective views of various stages for forming a semiconductor structure 100 of an SRAM cell (e.g., the SRAM cell 10_1 of FIG. 3), in accordance with some embodiments of the disclosure.

A substrate 101 is provided. The substrate 101 may be a semiconductor wafer such as a silicon wafer. Alternatively or additionally, the substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 101 includes an epitaxial layer. For example, the substrate 101 has an epitaxial layer overlying a bulk semiconductor.

Figure 4A:
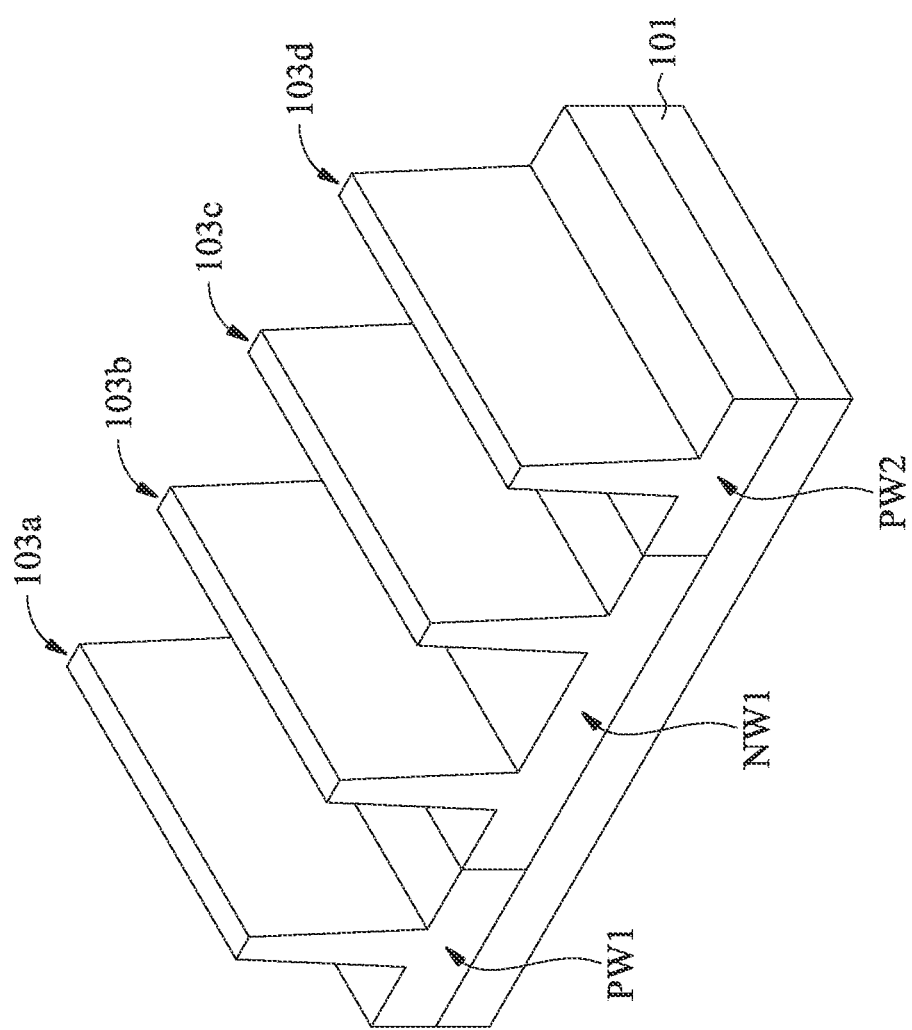
FIGS. 4A to 4J illustrate perspective views of various stages for forming a semiconductor structure of an SRAM cell, in accordance with some embodiments of the disclosure.

An N-type well region NW1 and two P-type well regions PW1 and PW2 are formed in the substrate 101, a fin 103a is formed over the P-type well region PW1, two fins 103b and 103c are formed over the N-type well region NW1, and a fin 103d is formed over the P-type well region PW2, as shown in FIG. 4A in accordance with some embodiments. In some embodiments, the N-type well region NW1 is between and adjacent to the P-type well regions PW1 and PW2.

In some embodiments, the N-type well region NW1 and the P-type well regions PW1 and PW2 are formed by ion implantation processes. More specifically, the N-type well region NW1 is doped with n-type dopants, such as phosphorus or arsenic, and the P-type well regions PW1 and PW2 are doped with p-type dopants, such as boron or $BF_2$, in accordance with some embodiments.

In some embodiments, the longitudinal directions of the fins 103a, 103b, 103c and 103d are substantially parallel to each other. Within the context of this specification, the word "substantially" means preferably at least 90%. In addition, in some embodiments, the fin 103a to 103d are formed by deposition process, patterning process and etching process. For example, a dielectric layer (not shown) is formed over the substrate 101, a mask layer (not shown) is formed over the dielectric layer, and a patterned photoresist layer (not shown) is formed over the mask layer.

The patterned photoresist layer may be formed by a deposition process and a subsequent patterning process. The deposition process for forming the patterned photoresist layer may include a chemical vapor deposition (CVD) process, a high-density plasma chemical vapor deposition (HDPCVD) process, a spin-on process, a sputtering process, or another applicable process. The patterning process for forming the patterned photoresist layer may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Moreover, the dielectric layer may be a buffer layer between the substrate 101 and the mask layer. In some embodiments, the dielectric layer is used as a stop layer when the mask layer is removed, and the dielectric layer is also used as an adhesion layer that is formed between the substrate 101 and the mask layer. The dielectric layer may be made of silicon oxide. The mask layer may be made of silicon oxide, silicon nitride, silicon oxynitride, or another applicable material. The dielectric layer and the mask layer may be formed by deposition processes, which may include a CVD process, a HDPCVD process, a spin-on process, a sputtering process, or another applicable process.

After the patterned photoresist layer is formed, the dielectric layer and the mask layer are patterned by using the patterned photoresist layer as a mask, in accordance with some embodiments. As a result, a patterned dielectric layer and a patterned mask layer are obtained. Afterwards, the patterned photoresist layer is removed. Next, an etching process is performed on the substrate 101 to form the fins 103a to 103d by using the patterned dielectric layer and the patterned mask layer as a mask. The etching process may be a dry etching process or a wet etching process.

In some embodiments, the substrate 101 is etched by a dry etching process. The dry etching process includes using a fluorine-based etchant gas, such as $SF_6$, $C_xF_y$, $NF_3$ or a combination thereof. The etching process may be a time-controlled process, and continue until the fins 103a to 103d reach a predetermined height. Moreover, in some embodiments, each of the fins 103a to 103d has a width that gradually decreases from the bottom to the top.

After the fins 103a to 103d are formed, the patterned dielectric layer and the patterned mask layer are removed, as shown in FIG. 4A in accordance with some embodiments. However, in some embodiments, the patterned dielectric layer and the patterned mask layer are removed after some subsequent processes are performed, which will be described below.

Figure 4B:
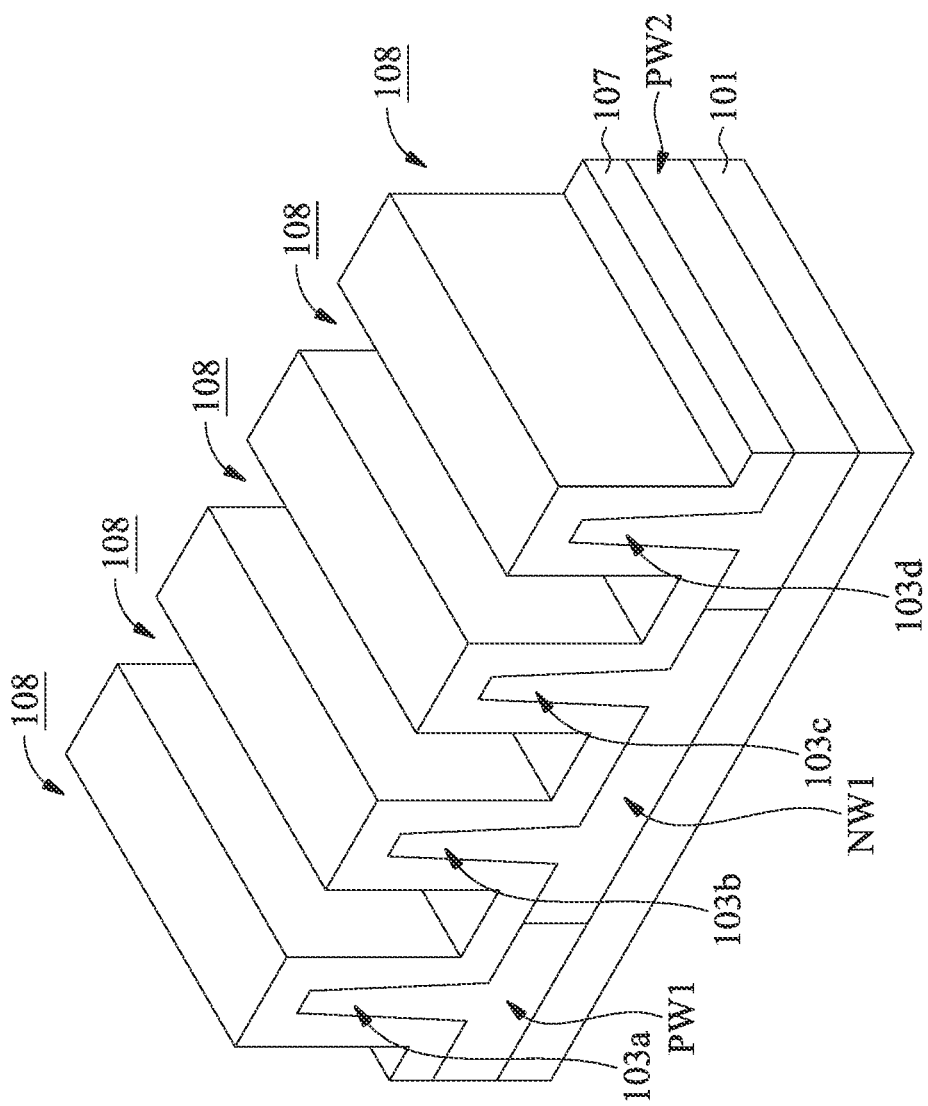

Afterwards, an insulating lining material 107 is formed covering the P-type well regions PW1 and PW2, the N-type well region NW1, and the fins 103a to 103d, as shown in FIG. 4B in accordance with some embodiments. In some embodiments, the insulating lining material 107 covers the top surfaces and sidewalls of the fins 103a to 103d. More specifically, in some embodiments, the insulating lining material 107 conformally lines the space between the fins 103a to 103d, and a plurality of openings 108 are formed over the insulating lining material 107 and between adjacent pairs of the fins 103a to 103d. In addition, in some embodiments, the patterned dielectric layer and the patterned mask layer remain over the fins 103a to 103d after the fins 103a to 103d are formed, and the insulating lining material 107 covers the patterned dielectric layer and the patterned mask layer.

The insulating lining material 107 may be made of silicon oxide, silicon nitride, silicon oxynitride, fluoride-doped silicate glass (FSG), or another low-k dielectric material. The insulating lining material 107 may be deposited by an atomic layer deposition (ALD) process, a CVD process, a flowable CVD (FCVD) process, a spin-on glass process, or another applicable process.

Figure 4C:
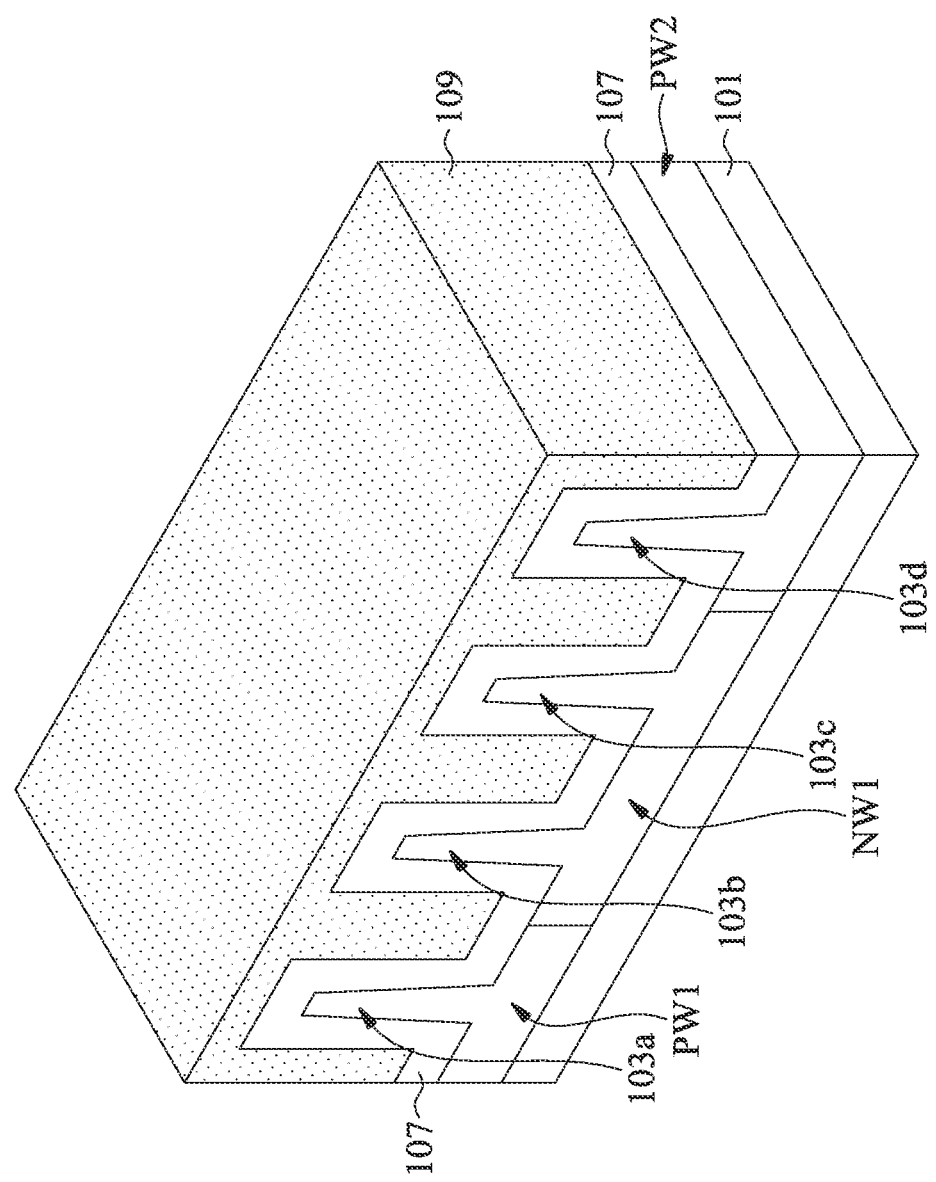

After the insulating lining material 107 is formed, a dielectric layer 109 is formed over the insulating lining material 107, as shown in FIG. 4C in accordance with some embodiments. In some embodiments, the dielectric layer 109 entirely fills the openings 108 (shown in FIG. 4B) and covers the portions of the insulating lining material 107 over the top surfaces and sidewalls of the fins 103a to 103d.

In some embodiments, the dielectric layer 109 is made of silicon oxide, a nitrogen-containing material, a carbon-containing material, a carbon- and nitrogen-containing material, or metal oxide. For example, the dielectric layer 109 is made of $SiO_2$, SiN, SiOC, SiON, SiCN, SiOCN, $HfO_2$, $Ta_2O_5$, $TiO_2$, $ZrO_2$, $Al_2O_3$, $Y_2O_3$, another applicable material or a combination thereof. The dielectric layer 109 may be deposited by an ALD process, a CVD process, or another applicable process. In some embodiments, the materials of the insulating lining material 107 and the dielectric layer 109 are different, and the dielectric constant of the dielectric layer 109 is higher than the dielectric constant of the insulating lining material 107.

Figure 4D:
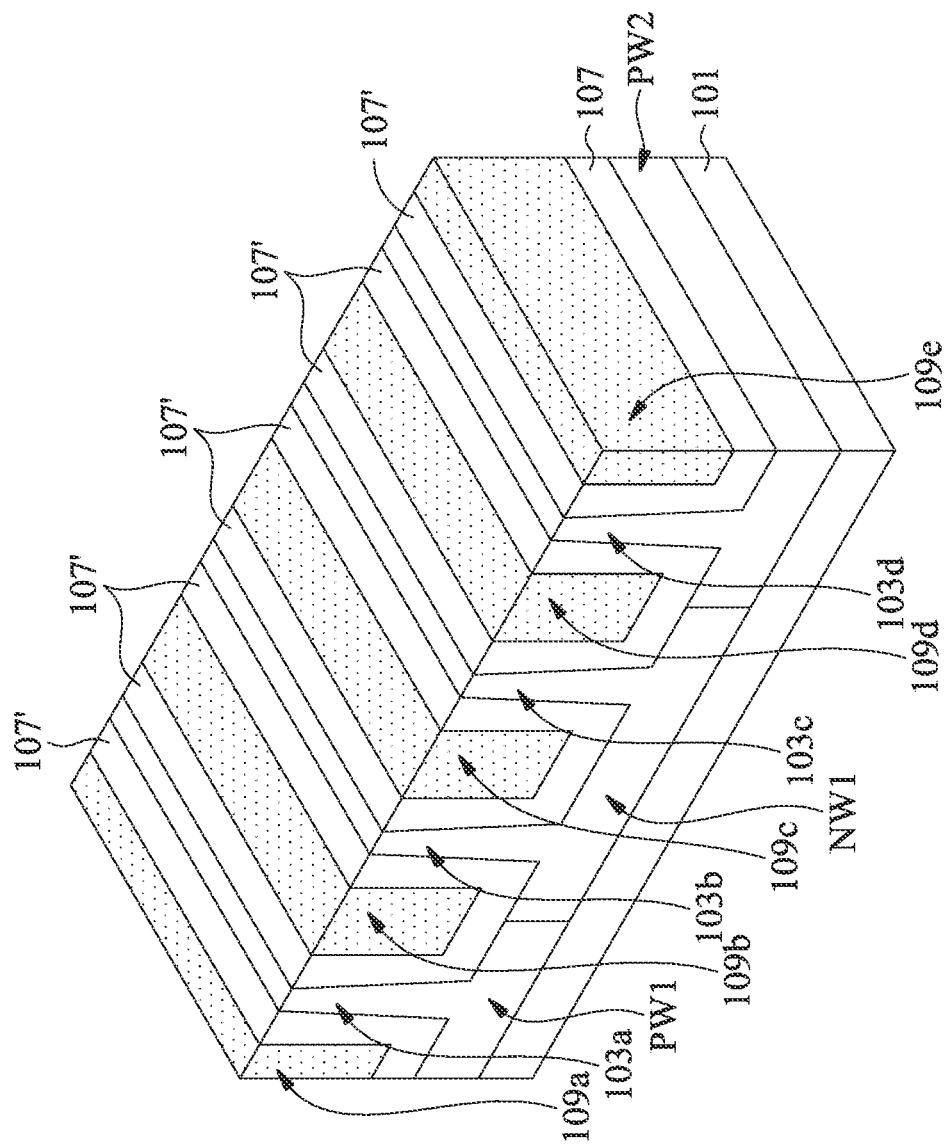

After the dielectric layer 109 is formed, a polishing process is performed on the structures shown in FIG. 4C, as shown in FIG. 4D in accordance with some embodiments. In some embodiments, the layers above the fins 103a to 103d are removed by the polishing process, such as a chemical mechanical polishing (CMP) process, so as to expose the fins 103a to 103d. More specifically, the dielectric layer 109 and the insulating lining material 107 above the fins 103a to 103d are successively removed by the polishing process, so that fins 103a, 103b, 103c and 103d are exposed. In addition, in some embodiments, the patterned dielectric layer and the patterned mask layer remain over the top surfaces of the fins 103a to 103d after the fins 103a to 103d are formed, and the patterned dielectric layer and the patterned mask layer are removed by the polishing process.

After the polishing process, the dielectric fins 109a, 109b, 109c, 109d and 109e are formed from the dielectric layer 109, which are the remaining portions of the dielectric layer 109, and the dielectric fins 109a to 109e are surrounded by the remaining insulating lining material 107'. Each of the dielectric fins 109a to 109e has a strip shape that is similar to the shape of each of the fins 103a to 103d, and the longitudinal directions of the dielectric fins 109a to 109e are substantially parallel to the longitudinal directions of the fins 103a to 103d. Therefore, the dielectric fins 109a to 109e may be referred to as dummy fins or hybrid fins, and the fins 103a to 103d may be referred to as active fins.

Figure 4E:
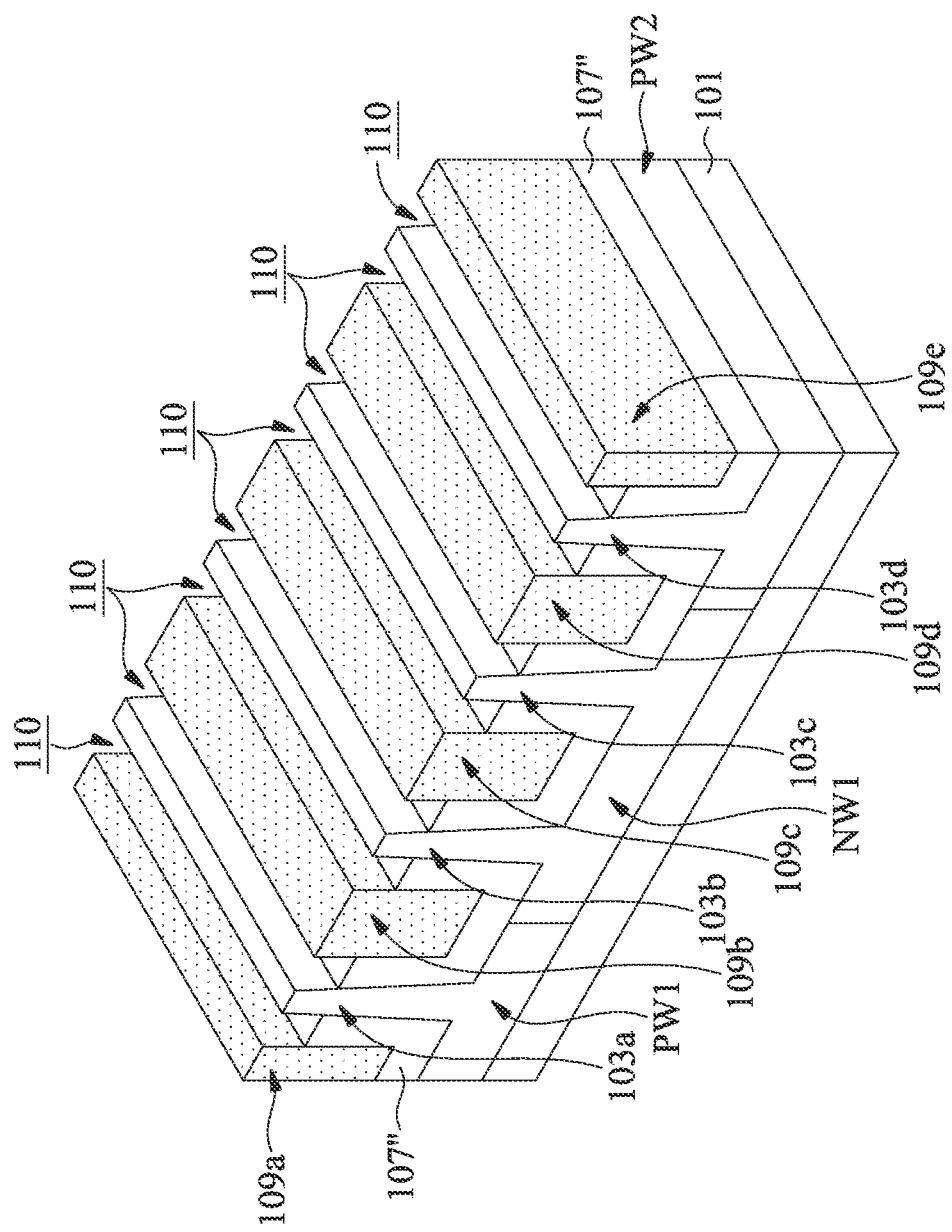

After the fins 103a to 103d are exposed by the polishing process, the remaining insulating lining material 107' is further recessed to form an insulating liner 107", as shown in FIG. 4E in accordance with some embodiments. In some embodiments, portions of the remaining insulating lining material 107' are removed by an etching process, so as to form openings 110 above the insulating liner 107", and the openings 110 are formed between adjacent fins 103a to 103d and dielectric fins 109a to 109e. For example, the etching process may be a dry etching process, a wet etching process, or a combination thereof.

In some embodiments, the remaining insulating lining layer 107' has an etching selectivity with respect to the dielectric fins 109a to 109e. That is, in some embodiments, the etching rate of the remaining insulating lining layer 107' is much higher than the etching rate of the dielectric fins 109a to 109e during the etching process. Therefore, the dielectric fins 109a to 109e are substantially not removed during the etching process for forming the insulating liner 107" and the openings 110.

Figure 4F:
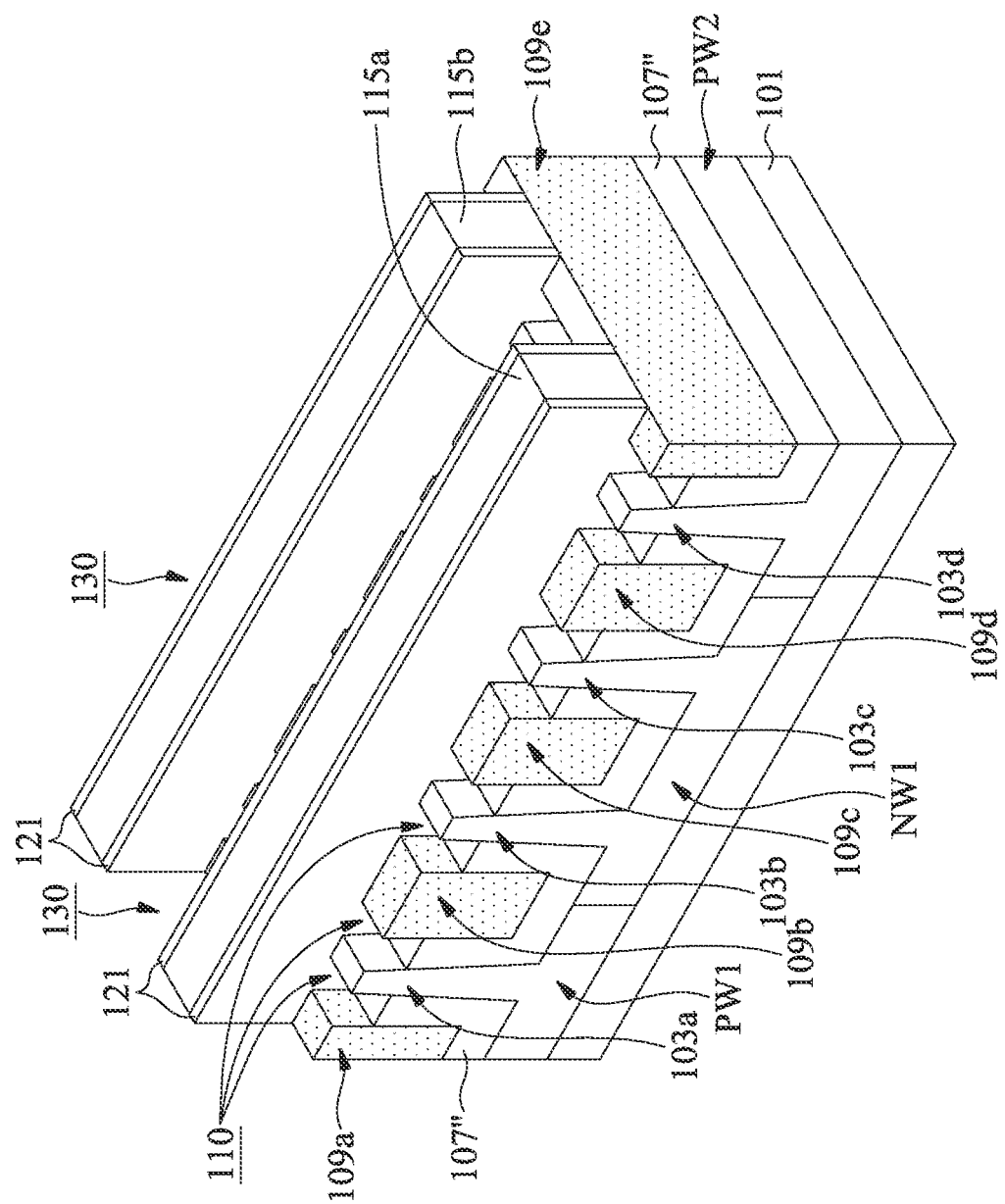

Afterwards, dummy gate structures 115a and 115b are formed over the insulating liner 107" and extend across the fins 103a to 103d and the dielectric fins 109a to 109e, as shown in FIG. 4F in accordance with some embodiments. The dummy gate structures 115a and 115b extend into the openings 110 between the fins 103a to 103d and the dielectric fins 109a to 109e. Each of the dummy gate structures 115a and 115b may include a dummy gate dielectric layer (not shown) and a dummy gate electrode layer (not shown) over the dummy gate dielectric layer.

Moreover, gate spacers 121 are formed on opposite sidewalls of each of the dummy gate structures 115a and 115b, and openings 130 are obtained between adjacent gate spacers 121, as shown in FIG. 4F in accordance with some embodiments. The gate spacers 121 may be made of silicon nitride, silicon oxide, silicon carbide, silicon oxynitride, or another applicable material.

Figure 4G:
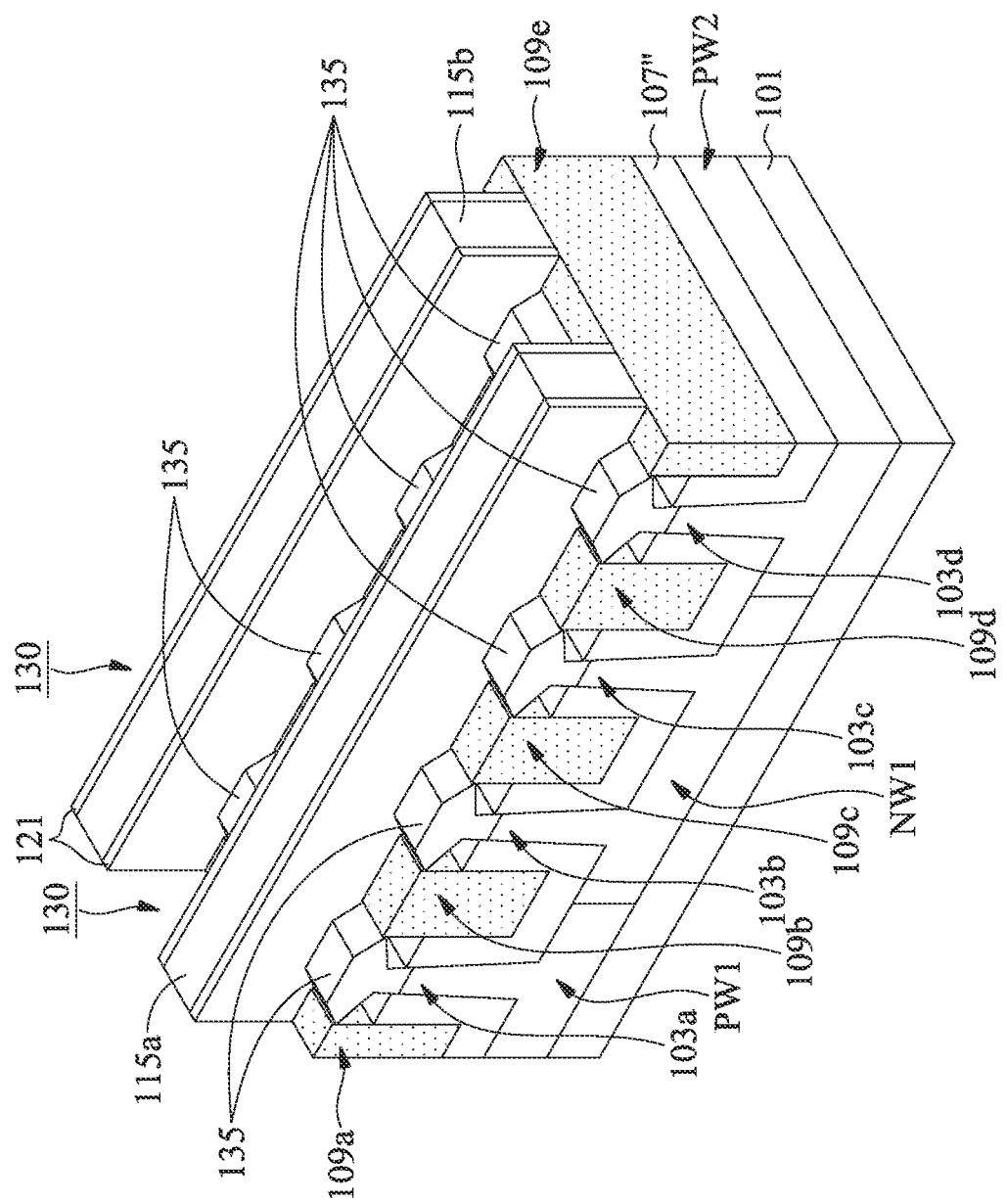

After the dummy gate structures 115a and 115b are formed, portions of the fins 103a to 103d that are exposed by the openings 130 are recessed, in accordance with some embodiments. More specifically, in some embodiments, the fins 103a to 103d are recessed by an etching process, so that the top surfaces of the recessed portions of the fins 103a to 103d are lower than the top surfaces of the dielectric fins 109a to 109e. In some embodiments, the top surfaces of the recessed portions of the fins 103a to 103d are lower than the top surfaces of the insulating liners 107". Then, S/D structures 135 are formed over the recessed portions of the fins 103a to 103d, as shown in FIG. 4G in accordance with some embodiments.

In some embodiments, a strained material is grown over the recessed portions of the fins 103a to 103d by an epitaxial process to form the S/D structures 135. The S/D structures 135 may impart stress or strain to the channel regions under the dummy gate structures 115a and 115b to enhance the carrier mobility of the substantially formed transistors and improve the performance of the transistors. In some embodiments, the S/D structures 135 are formed on opposite sidewalls of the corresponding dummy gate structure 115a or 115b.

In some embodiments, the S/D structures 135 include Si, Ge, SiGe, SiP, SiC, SiPC, SiAs, InAs, InGaAs, InSb, GaAs, GaSb, InAlP, InP, or the like. More specifically, in some embodiments, the S/D structures 135 are made of an N-type semiconductor material for the substantially formed NMOS transistors (e.g., the pull-down transistors PD-1, PD-2 and the pass-gate transistors PG-1, PG-2), the S/D structures 135 may include epitaxially grown Si, SiP, SiC, SiPC, SiAs, a combination thereof, or another applicable epitaxially grown semiconductor material.

In some embodiments, the S/D structures 135 are made of a P-type semiconductor material for the substantially formed PMOS transistors (e.g., the pull-up transistors PU-1, PU-2 and the isolation transistors IS-1, IS-2), the S/D structures 135 may include epitaxially grown Si, Ge, SiGe, SiGeC, a combination thereof, or another applicable epitaxially grown semiconductor material.

Figure 4H:
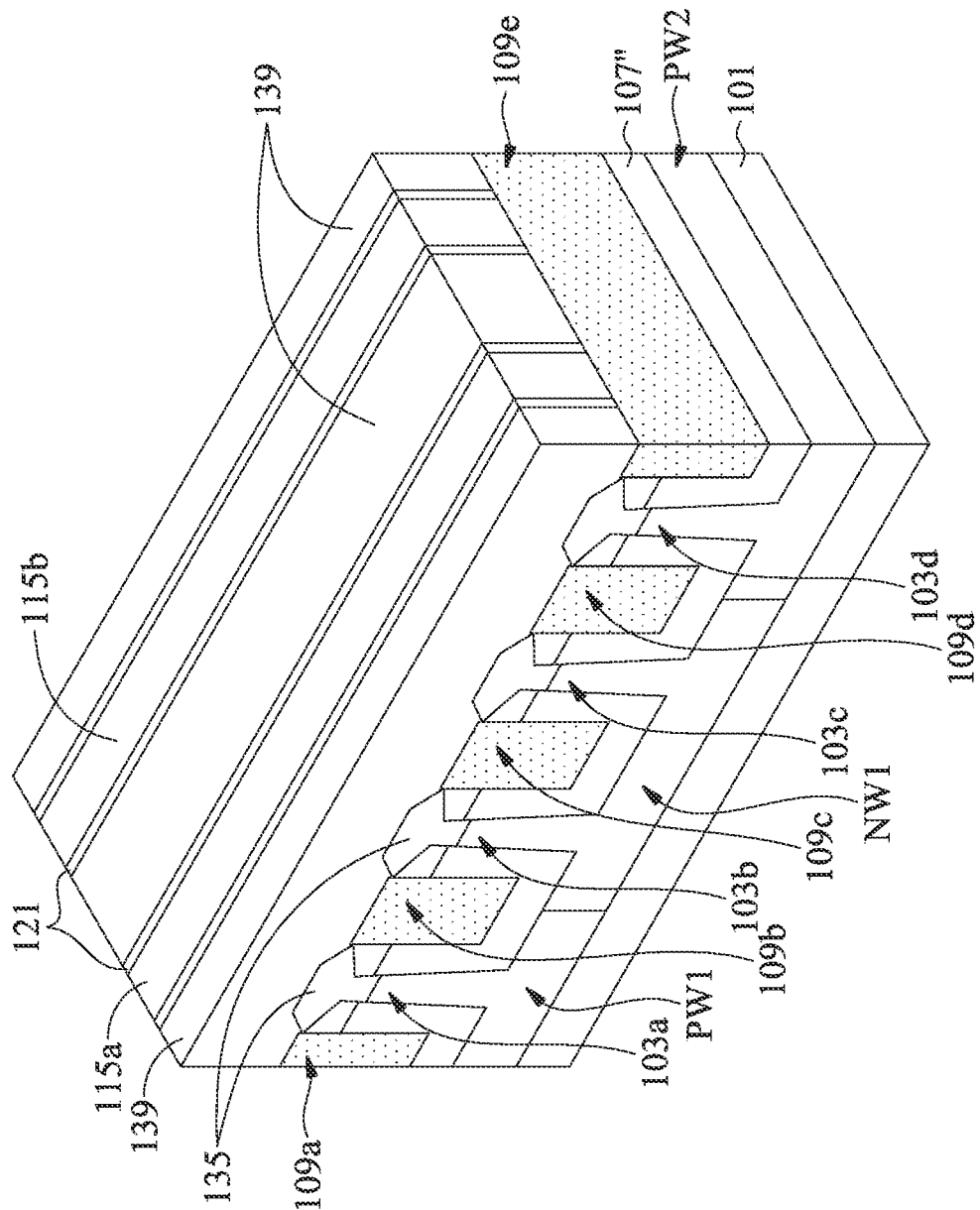

Afterwards, an inter-layer dielectric (ILD) layer 139 is formed over the S/D structures 135, as shown in FIG. 4H in accordance with some embodiments. The ILD layer 139 may include multilayers made of multiple dielectric materials, such as silicon oxide, silicon nitride, silicon oxynitride, tetraethoxysilane (TEOS) oxide, phosphosilicate glass (PSG), borophosphosilicate glass (BPSG), low-k dielectric material, and/or other applicable dielectric materials. The ILD layer 139 may be formed by CVD, ALD, physical vapor deposition (PVD), spin-on coating, or another applicable process.

In some embodiments, the ILD layer 139 fills the openings 130 (shown in FIG. 4G) and extend over the dummy gate structures 115a, 115b and the gate spacers 121. Afterwards, a planarization process, such as a CMP process, is performed on the ILD layer 139 until the top surfaces of the dummy gate structures 115a and 115b are exposed, in accordance with some embodiments. In some embodiments, the spaces confined by the insulating liners 107", the S/D structures 135 and dielectric fins 109a to 109e may not be completely filled by the dielectric material for ILD layer 139.

Figure 4I:
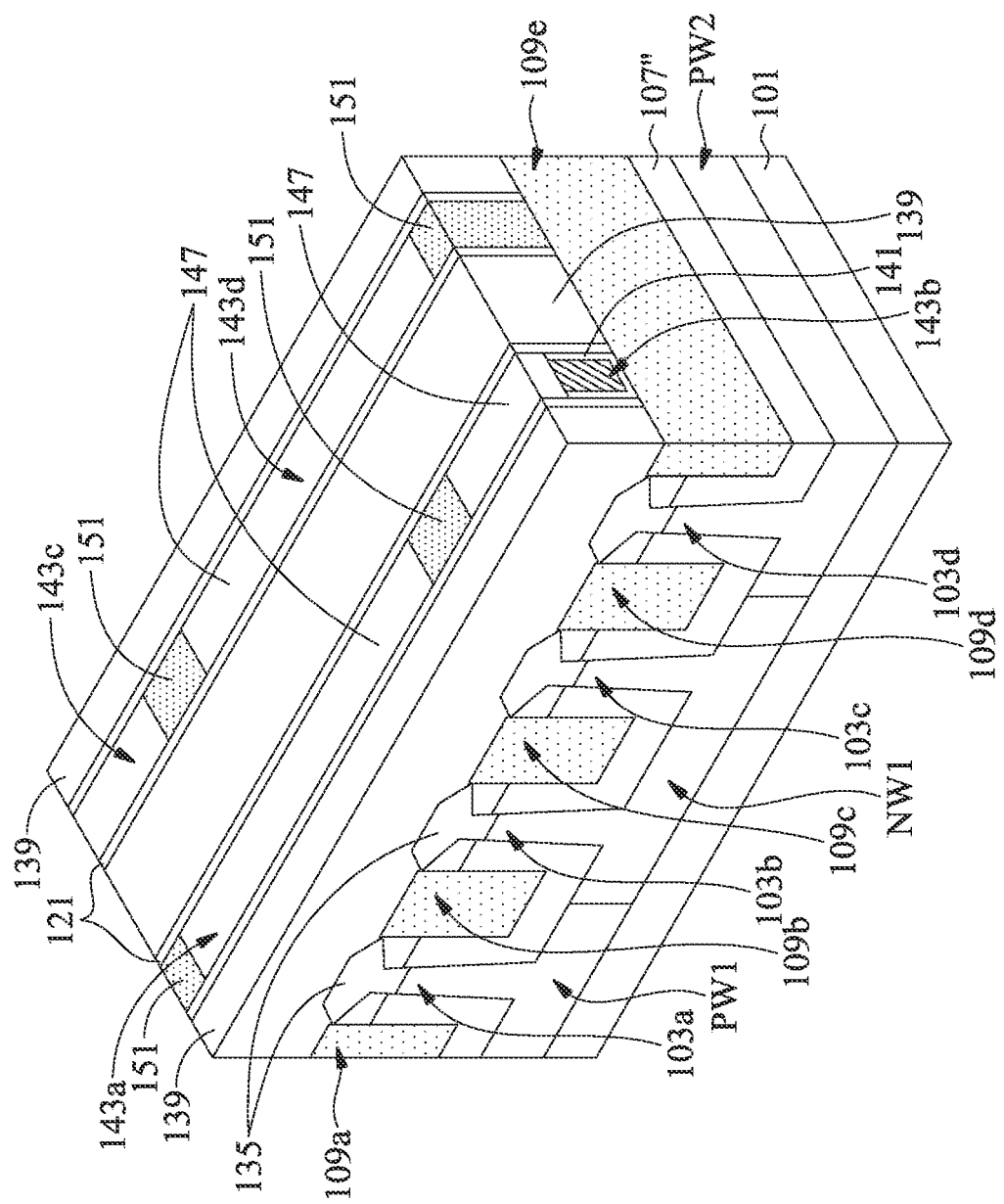

After the ILD layer 139 is formed, the dummy gate structures 115a and 115b are removed and replaced with gates structures including a gate dielectric layer 141 and a gate electrode material (not shown) over the gate dielectric layer 141, a top portion of the gate structures is replaced with a hard mask 147, and portions of the gate structures are replaced by dielectric structures 151 between gate electrodes 143a, 143b, 143c and 143d, which are obtained from the above-mentioned gate electrode material, as shown in FIG. 4I in accordance with some embodiments. In some embodiments, the gate electrodes 143a, 143b, 143c and 143d are covered by the hard mask 147, and the details of the gate electrodes 143a to 143d are shown in the layout of FIG. 3 and the cross-sectional view of FIG. 5A, which will be described in detail below.

In some embodiments, the dummy gate structures 115a and 115b are removed by an etching process, such as a dry etching process or a wet etching process. The gate dielectric layer 141 may be a single layer or multiple layers. In addition, in some embodiments, the gate dielectric layer 141 is made of silicon oxide, silicon nitride, silicon oxynitride (SiON), dielectric material(s) with high dielectric constant (high-k), such as metal oxide. Examples of the high-k dielectric material may include hafnium oxide (HfO$_2$), hafnium silicon oxide (HfSiO), hafnium tantalum oxide (HMO), hafnium titanium oxide (HfTiO), hafnium zirconium oxide (HfZrO), zirconium oxide, titanium oxide, aluminum oxide, or other applicable dielectric materials. In some embodiments, the gate dielectric layer 141 may be formed by CVD, PVD, ALD, plasma enhanced chemical vapor deposition (PECVD), spin coating, or another applicable process.

In some embodiments, each of the gate electrodes 143a, 143b, 143c and 143d includes a work-function metal layer (not shown) and a metal conductor layer (not shown) over the work-function metal layer. In some embodiments, the metal conductor layers are made of a conductive material such as aluminum (Al), copper (Cu), tungsten (W), titanium (Ti), tantalum (Ta), or another applicable material. In some embodiments, the metal conductor layers may be formed by a deposition process, such as CVD, PVD, ALD, HDPCVD, PECVD, or metal organic CVD (MOCVD).

The work-function metal layers may include N-type work-function metal or P-type work-function metal. The N-type work-function metal may include W, Cu, Ti, Ag, Al, TiAl, TiAlN, TaAl, TaAlC, TaC, TaCN, TaSiN, Mn, Zr, another applicable N-type work-function metal, or a combination thereof. The P-type work-function metal may include TiN, TaN, Ru, Mo, Al, WN, ZrSi$_2$, MoSi$_2$, TaSi$_2$, NiSi$_2$, another applicable P-type work-function metal, or a combination thereof. In some embodiments, each of the work-function metal layers of the gate electrodes 143a to 143d are the same. In some embodiments, some of the work-function metal layers of the gate electrodes 143a to 143d are different.

Moreover, the hard mask 147 is used as a mask for performing a self-aligned etching process to form contacts electrically connected to the S/D structures 135, which will be described in FIG. 4J below. In some embodiments, the hard mask 147 is made of silicon oxide, silicon nitride, silicon carbonitride (SiCN), silicon oxide carbonitride (SiOCN), or SiLK. It should be noted that the material of the hard mask 147 is different from the material of the ILD layer 139. In some embodiments, the hard mask 147 is formed by deposition process, such as a CVD process, an ALD process, or another applicable process.

In addition, the dielectric structures 151 are gate-cut structures for the gate electrodes 143a, 143b, 143c and 143d. In some embodiments, the dielectric structures 151 are formed by a cut metal gate (CMG) process. In some embodiments, the structure of FIG. 4I is a perspective view of an intermediate stage for forming the SRAM cell 10_1 of FIG. 3, the gate electrode 143a is shared by the pull-down transistor PD-2, the pull-up transistor PU-2 and the isolation transistor IS-1, and the gate electrode 143d is shared by the pull-down transistor PD-1, the pull-up transistor PU-1 and the isolation transistor IS-2. The gate electrodes 143a and 143b are separated by one of the dielectric structures 151, and the gate electrodes 143c and 143d are separated by another one of the dielectric structures 151. That is, the dielectric structures 151 are gate-cut structures for the gate electrodes 143a and 143b and for the gate electrodes 143c and 143d.

In some embodiments, the dielectric structures 151 are made of silicon oxide, silicon nitride, SiON, SiCN, SiOCN, another applicable dielectric material, or a combination thereof. In some embodiments, the dielectric structures 151 are formed by an etching process and a subsequent deposition process. The dielectric structures 151 may be formed before, during or after the formation of the hard mask 147. In some embodiments, the dielectric structures 151 and the hard mask 147 are made of the same material and are formed simultaneously.

Figure 4J:
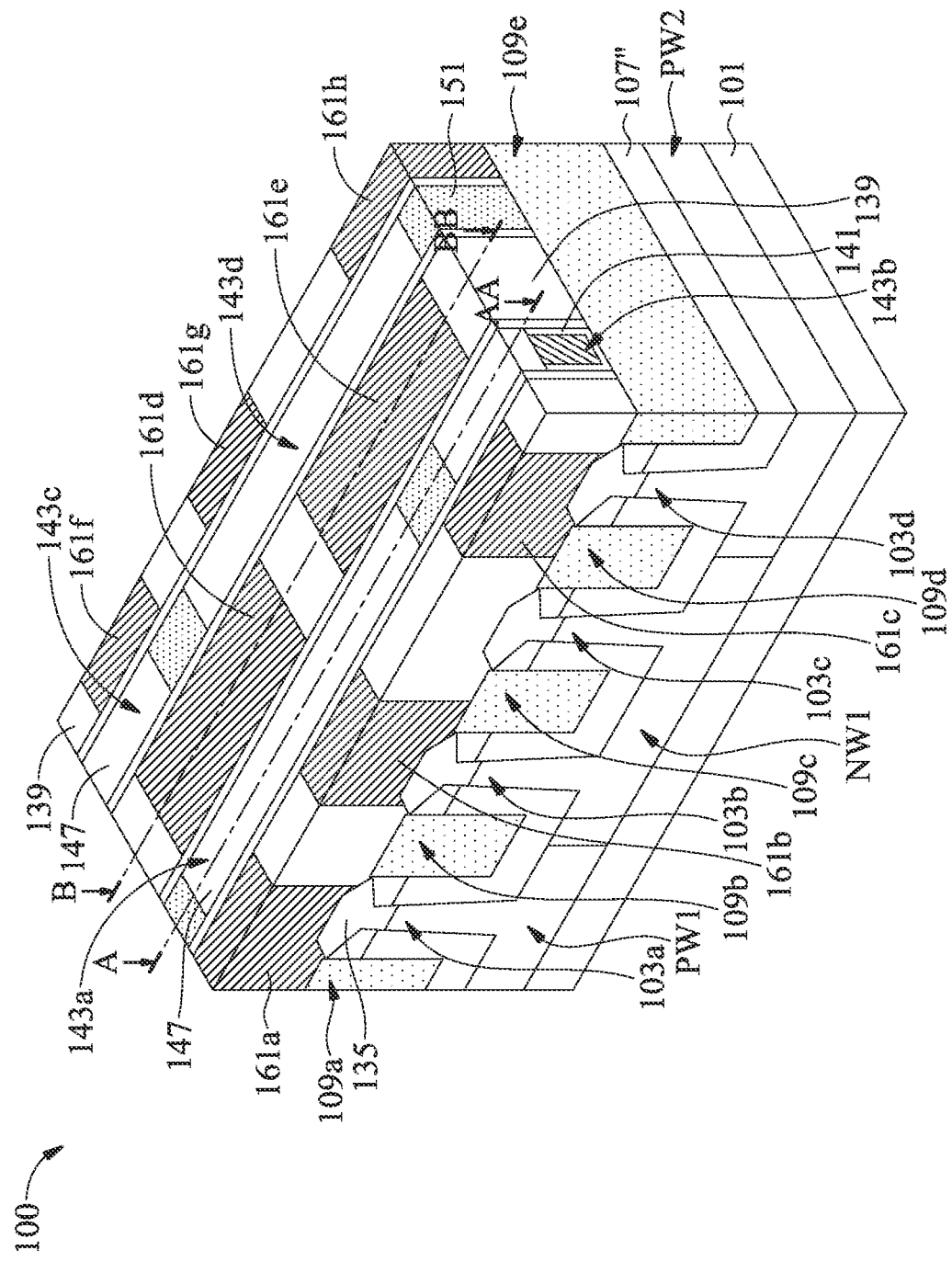

Afterwards, portions of the ILD layer 139 over the S/D structures 135 are removed, and a plurality of contacts 161a, 161b, 161c, 161d, 161e, 161f, 161g and 161h are formed over the S/D structures 135, as shown in FIG. 4J in accordance with some embodiments. In some embodiments, the ILD layer 139 is penetrated by the contacts 161a to 161h, and each of the contacts 161a to 161h are electrically connected to the corresponding underlying S/D structure 135.

More specifically, in some embodiments, portions of the ILD layer 139 over the S/D structures 135 are removed to form contact openings (not shown) by an etching process, and then, the contact openings are filled by the contacts 161a to 161h by a deposition process. In some embodiments, the contacts 161a to 161h are made of W, Co, Ti, Al, Cu, Ta, Pt, Mo, Ag, Mn, Zr, Ru, or another application material. In some embodiments, the deposition process for forming the contacts 161a to 161h include a CVD process, a PVD process, an ALD process, a plating process, or another application process. After the contacts 161a to 161h are formed, the semiconductor structure 100 of an SRAM cell (e.g., the SRAM cell 10_1 of FIG. 3) is obtained.

In some embodiments, the semiconductor substrate 100 of the SRAM cell (e.g., the SRAM cell 10_1 of FIG. 3) includes dielectric fins 109a to 109e (i.e., dummy fins) between adjacent fins 103a to 103d (i.e., active fins). Therefore, the undesirable bridge problem between S/D structures 135 can be prevented while the sizes of the S/D structures 135 reach their maximum values. As a result, the contact resistance between the S/D structures 135 and the contacts 161a to 161h overlying the S/D structures 135 may be reduced, and the performance and the operation speeds of the semiconductor structure 100 of the SRAM cell may be enhanced. Although each of the dielectric fins 109a to 109e shown in FIG. 4J includes a single layer, each of the dielectric fins 109a to 109e may include multilayers made of multiple dielectric materials, and the interfaces between the multiple dielectric materials may be vertical and/or horizontal to the top surfaces of the dielectric fins 109a to 109e.

Figure 5A:
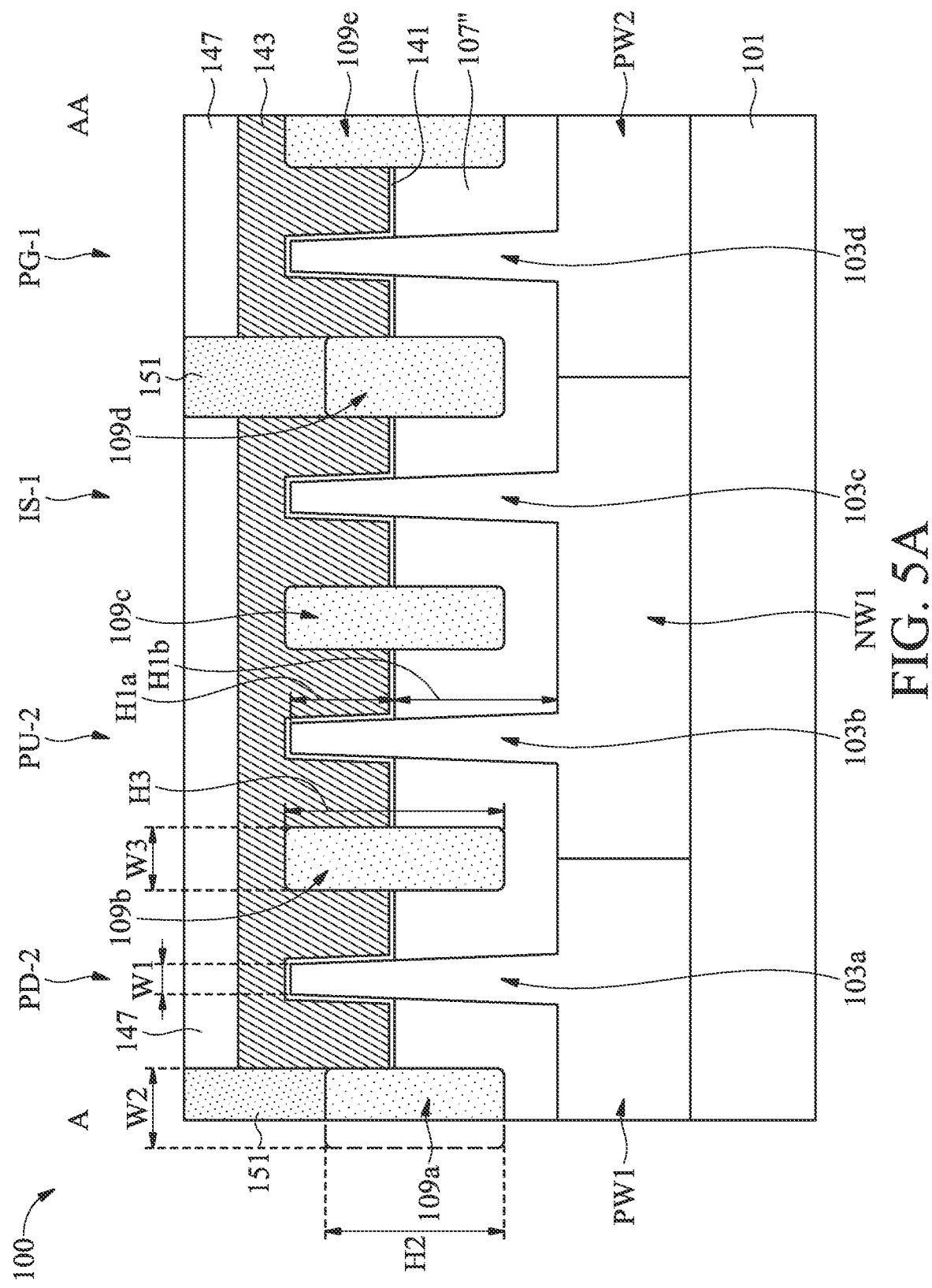
FIG. 5A illustrates a cross-sectional view of the semiconductor structure of the SRAM cell along line A-AA in FIG. 4J, in accordance with some embodiments of the disclosure.
Figure 5B:
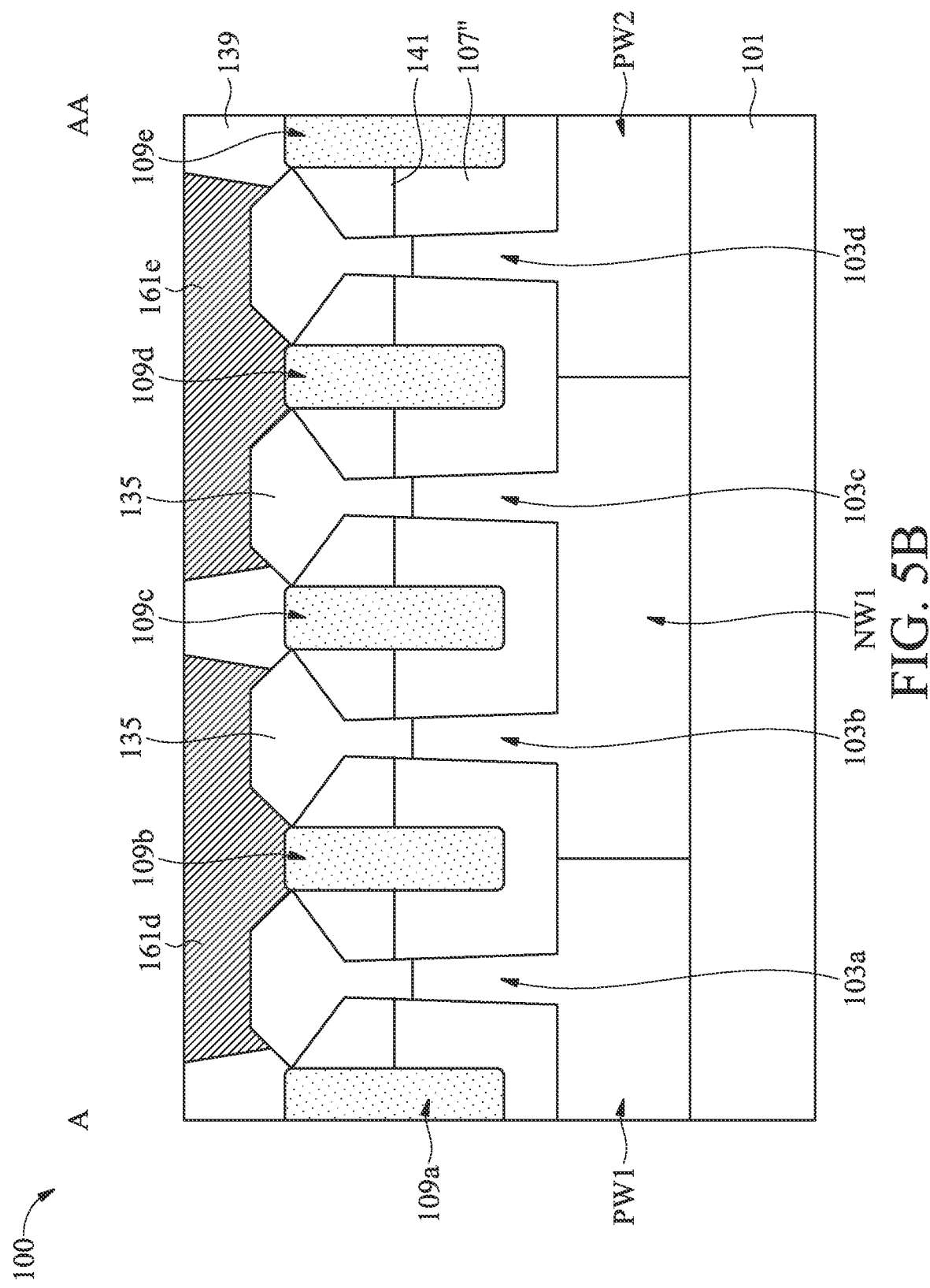
FIG. 5B illustrates a cross-sectional view of the semiconductor structure of the SRAM cell along line B-BB in FIG. 4J, in accordance with some embodiments of the disclosure.

FIG. 5A illustrates a cross-sectional view of the semiconductor structure 100 of the SRAM cell along line A-AA in FIG. 4J, and FIG. 5B illustrates a cross-sectional view of the semiconductor structure 100 of the SRAM cell along line B-BB in FIG. 4J, in accordance with some embodiments of the disclosure. In some embodiments, the above-mentioned SRAM cell is the SRAM cell 10_1 of FIG. 3.

Each of the fins 103a, 103b, 103c and 103d has a width W1, each of the dielectric fins directly below the dielectric structures 151 (e.g., the dielectric fins 109a and 109d) has a width W2, and each of the dielectric fins covered by the gate electrodes 143a, 143b, 143c and 143d (e.g., the dielectric fins 109b, 109c and 109e) has a width W3, as shown in FIG. 5A in accordance with some embodiments. In some embodiments, the width W2 and the width W3 are greater than the width W1.

More specifically, in some embodiments, the ratio (W2/W1) of the width W2 to the width W1 and the ratio (W3/W1) of the width W3 to the width W1 are greater than about 1.2. If the ratios (W2/W1 and W3/W1) are too low (i.e., less than 1.2), the widths W2 and W3 will be too small, and the dielectric fins 109a to 109e may collapse.

In addition, the width W2 and the width W3 are in a range from about 4 nm to about 40 nm, in accordance with some embodiments. In some embodiments, the width W2 is substantially the same as the width W3. Furthermore, in some embodiments, the ratio of the width of the dielectric fins located at the boundaries of adjacent SRAM cells to the width of the dielectric fins located within the SRAM cells is greater than about 1.1.

In some embodiments, the semiconductor structure 100 corresponds to the SRAM cell 10_1 of FIG. 3, the fins 103a, 103b, 103c and 103d respectively correspond to the fins of the second pull-down transistor PD-2, the second pull-up transistor PU-2, the first isolation transistor IS-1 and the first pass-gate transistor PG-1, and all of the fins 103a, 103b, 103c and 103d are made of silicon.

In some embodiments, each of the fins of the PMOS transistors (e.g., the fins 103b and 103c of the second pull-up transistor PU-2 and the first isolation transistor IS-1) comprises an upper portion (not shown) above the insulating liner 107" and a lower portion (not shown) under the upper portion, the upper portion is made of SiGe and has a Ge atomic % in a range from about 5% to about 35%, and the lower portion is made of Si.

Moreover, each of the upper portion of the fins of the PMOS transistors has a height H1a, each of the lower portion of the fins of the PMOS transistors has a height H1b. In some embodiments, the height H1a is in a range from about 40 nm to about 70 nm, and the height H1b is in a range from about 50 nm to about 200 nm.

In addition, each of the dielectric fins located directly under the dielectric structures 151 (e.g., the dielectric fins 109a and 109d) has a height H2, and each of the dielectric fins covered by the gate electrodes 143a, 143b, 143c and 143d (e.g., the dielectric fins 109b and 109c) has a height H3. In some embodiments, the height H3 is greater than the height H2 since the top portions of the dielectric fins located directly under the dielectric structures 151 may be removed during the cut metal gate (CMG) process. More specifically, the difference between the heights H3 and H2 is in a range from about 3 nm to about 30 nm.

The S/D structures 135 contact the sidewalls of the dielectric fins 109a, 109b, 109c, 109d and 109e, and the contacts 161d and 161e are formed over and electrically connected to the corresponding underlying S/D structures 135, as shown in FIG. 5B in accordance with some embodiments. The S/D structures 135 formed over the recessed portions of the fins 103a to 103d can be grown in the regions confined by the dielectric fins 109a to 109e, allowing the S/D structures 135 to contact the dielectric fins 109a to 109e. Therefore, the undesirable bridge problem between the S/D structures 135 can be prevented while the sizes of the S/D structures 135 reach their maximum values. As a result, the contact resistance between the S/D structures 135 and the contacts 161d and 161e may be reduced, and the performance and the operation speeds of the transistors in the SRAM cell (e.g., the SRAM cell 10_1) may be enhanced.

Figure 6:
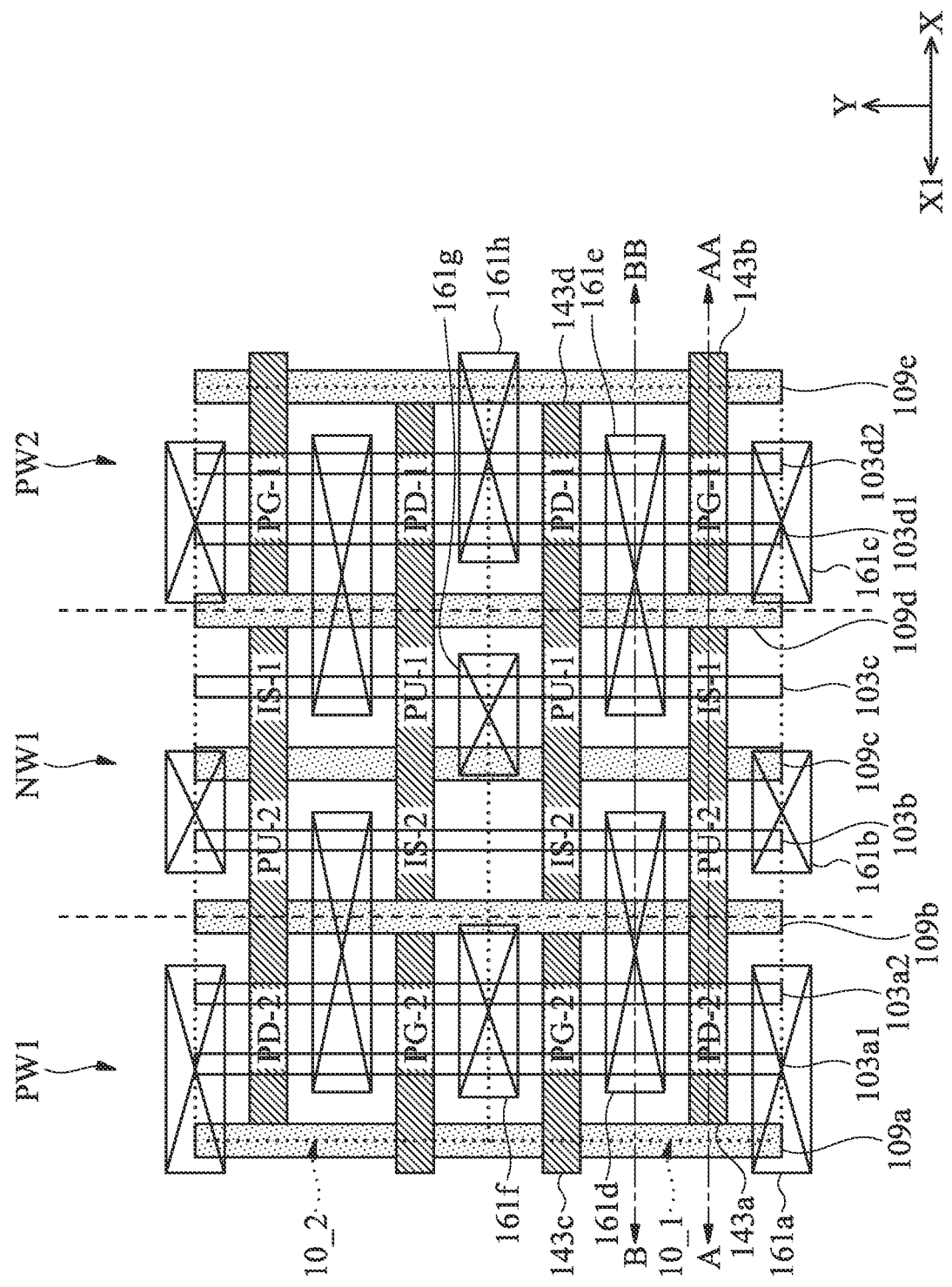
FIG. 6 illustrates a layout of the SRAM of FIG. 1, in accordance with some embodiments of the disclosure.
Figure 7A:
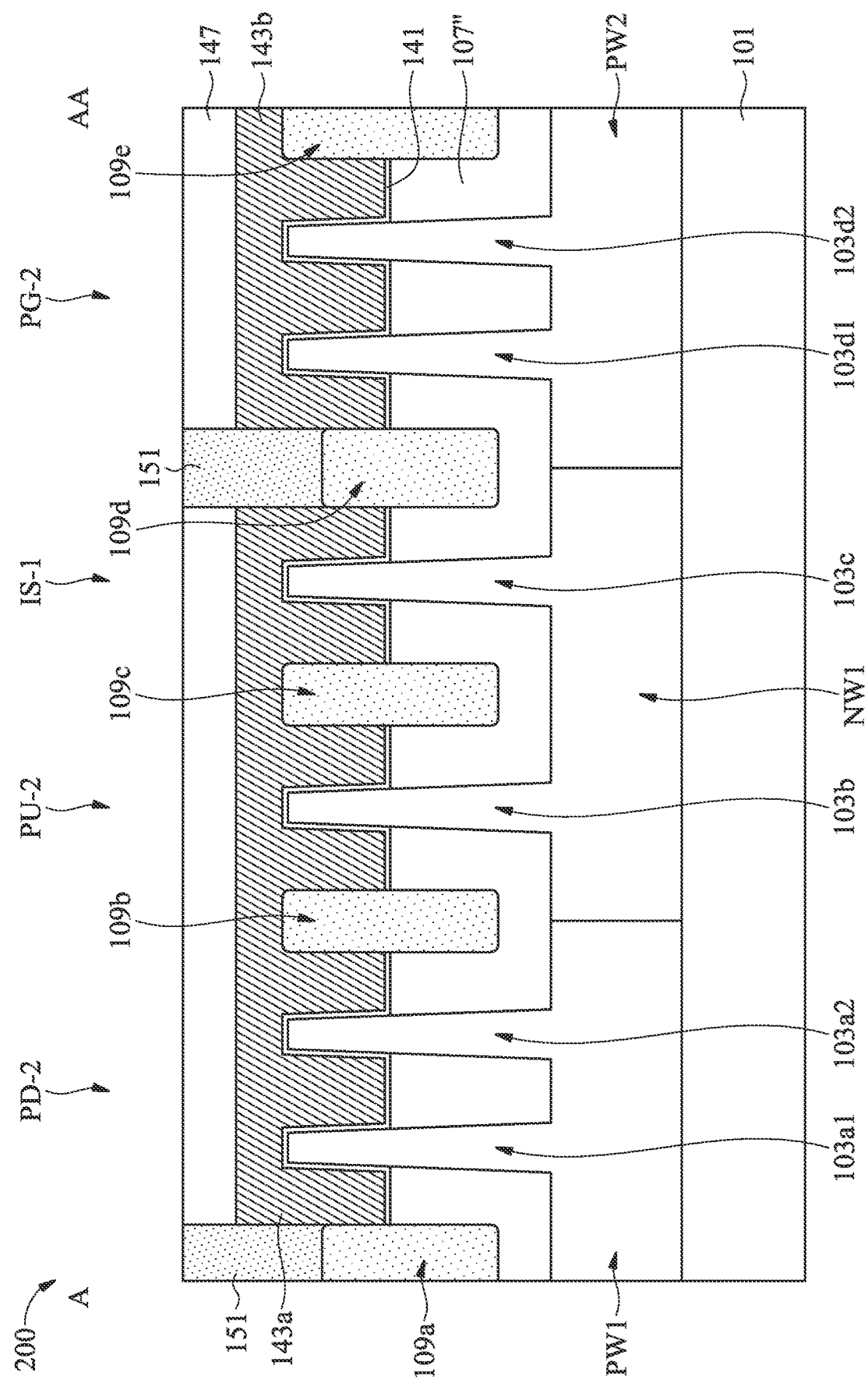
FIG. 7A illustrates a cross-sectional view of the semiconductor structure of the SRAM cell along line A-AA in FIG. 6, in accordance with some embodiments of the disclosure.
Figure 7B:
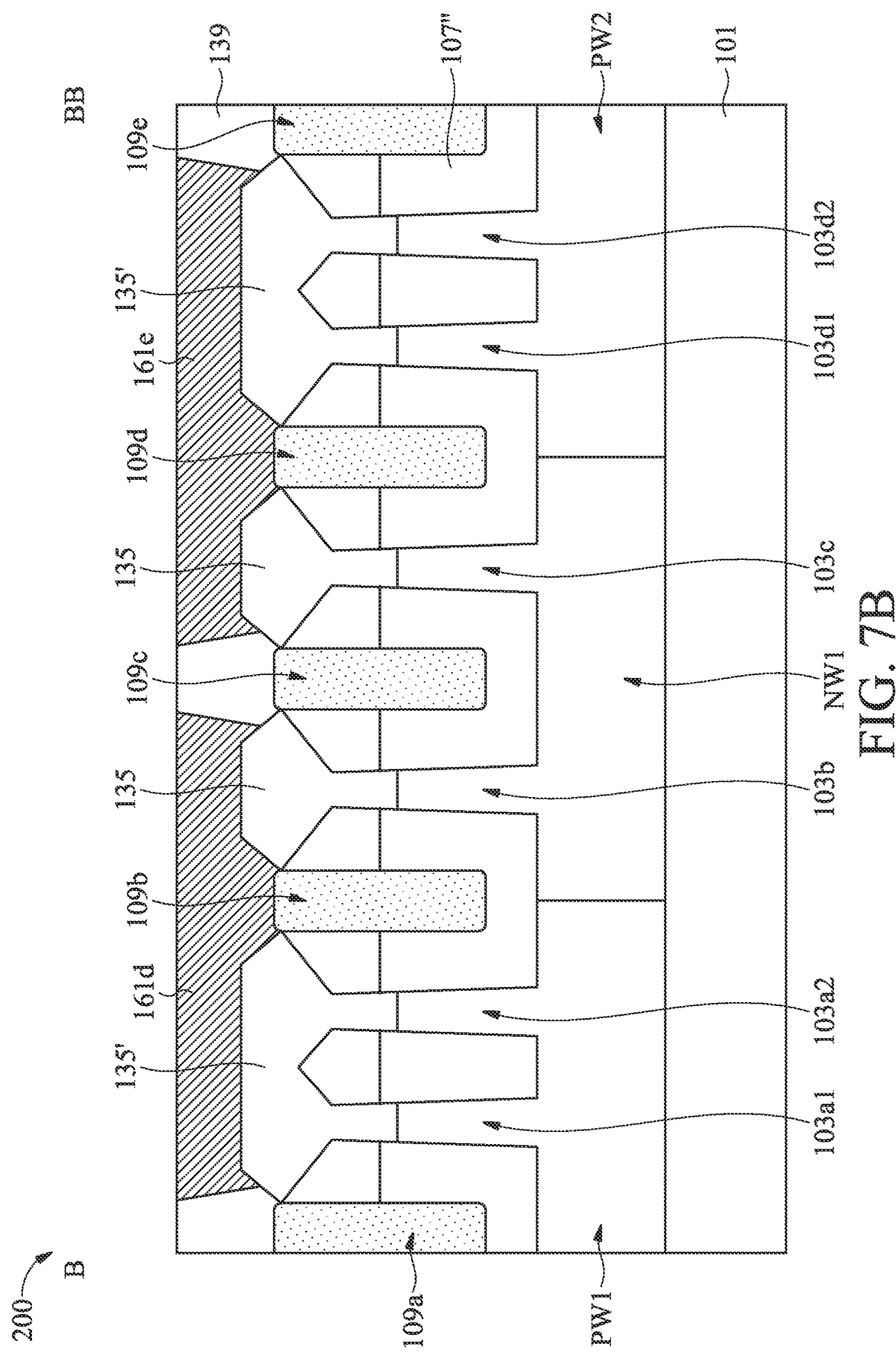
FIG. 7B illustrates a cross-sectional view of the semiconductor structure of the SRAM cell along line B-BB in FIG. 6, in accordance with some embodiments of the disclosure.

FIG. 6 illustrates a layout of the SRAM of FIG. 1, FIG. 7A illustrates a cross-sectional view of a semiconductor structure 200 of the SRAM cell 10_1 along line A-AA in FIG. 6, and FIG. 7B illustrates a cross-sectional view of the semiconductor structure 200 of the SRAM cell 10_1 along line B-BB in FIG. 6, in accordance with some embodiments of the disclosure. The details of the semiconductor structure 200 may be similar to the semiconductor structure 100, and are not repeated herein for simplicity.

Although the layout of FIG. 6 shows only two SRAM cells 10_1 and 10_2, other SRAM cells may be combined with the layout of FIG. 6. For example, similar to FIG. 3, a duplicate SRAM cell for the SRAM cell 10_1 flipped over the Y-axis and a duplicate cell for the SRAM cell 10_2 flipped over the Y-axis may be combined with the layout of FIG. 6.

In some embodiments, the transistors within the SRAM cells 10_1 and 10_2 are fin transistors in the N-type well region NW1, and in the P-type well regions PW1 and PW2. The N-type well region NW1 is positioned between and adjacent to the P-type well regions PW1 and PW2. The layout of FIG. 6 is similar to the layout of FIG. 3 except that the NMOS transistors (i.e., the first pull-down transistors PD-1, the second pull-down transistor PD-2, the first pass-gate transistors PG-1 and the second pass-gate transistor PG-2) are dual-fin transistors. In some embodiments, each of the above-mentioned NMOS transistors includes a multiple-fin, and each of the PMOS transistors (i.e., the first pull-up transistor PU-1, the second pull-transistor PU-2, the first isolation transistor IS-1 and the second isolation transistor IS-2) includes a single-fin.

More specifically, the second pull-down transistor PD-2 and the second pass-gate transistor PG-2 share fins 103a1 and 103a2, and the first pull-down transistor PD-1 and the first pass-gate transistor PG-1 share fins 103d1 and 103d2, as shown in FIG. 6 in accordance with some embodiments. In some embodiments, the gate electrode 143a is shared by the second pull-down transistor PD-2, the second pull-up transistor PU-2, and the first isolation transistor IS-1, and the gate electrode 143a extends across the fins 103a1, 103a2, 103b and 103c. In some embodiments, the gate electrode 143b of the first pass-gate transistor PG-1 extends across the fins 103d1 and 103d2.

Moreover, in some embodiments, the gate electrode 143c of the second pass-gate transistor PG-2 extends across the fins 103a1 and 103a2. In addition, the gate electrode 143d is shared by the second isolation transistor IS-2, the first pull-up transistor PU-1 and the first pull-down transistor PD-1, and the gate electrode 143d extends across the fins 103b, 103c, 103d1 and 103d2.

A merged S/D structure 135' is formed over the recessed portions of the fins 103a1 and 103a2, and another merged S/D structure 135' is formed over the recessed portions of the fins 103d1 and 103d2, as shown in FIG. 7B in accordance with some embodiments. In some embodiments, each of the dielectric fins 109b and 109d is sandwiched between one of the merged S/D structure 135' and one of the S/D structure 135. Moreover, each of the contacts 161d and 161e covers one of the merged S/D structure 135' and one of the S/D structure 135.

Figure 8:
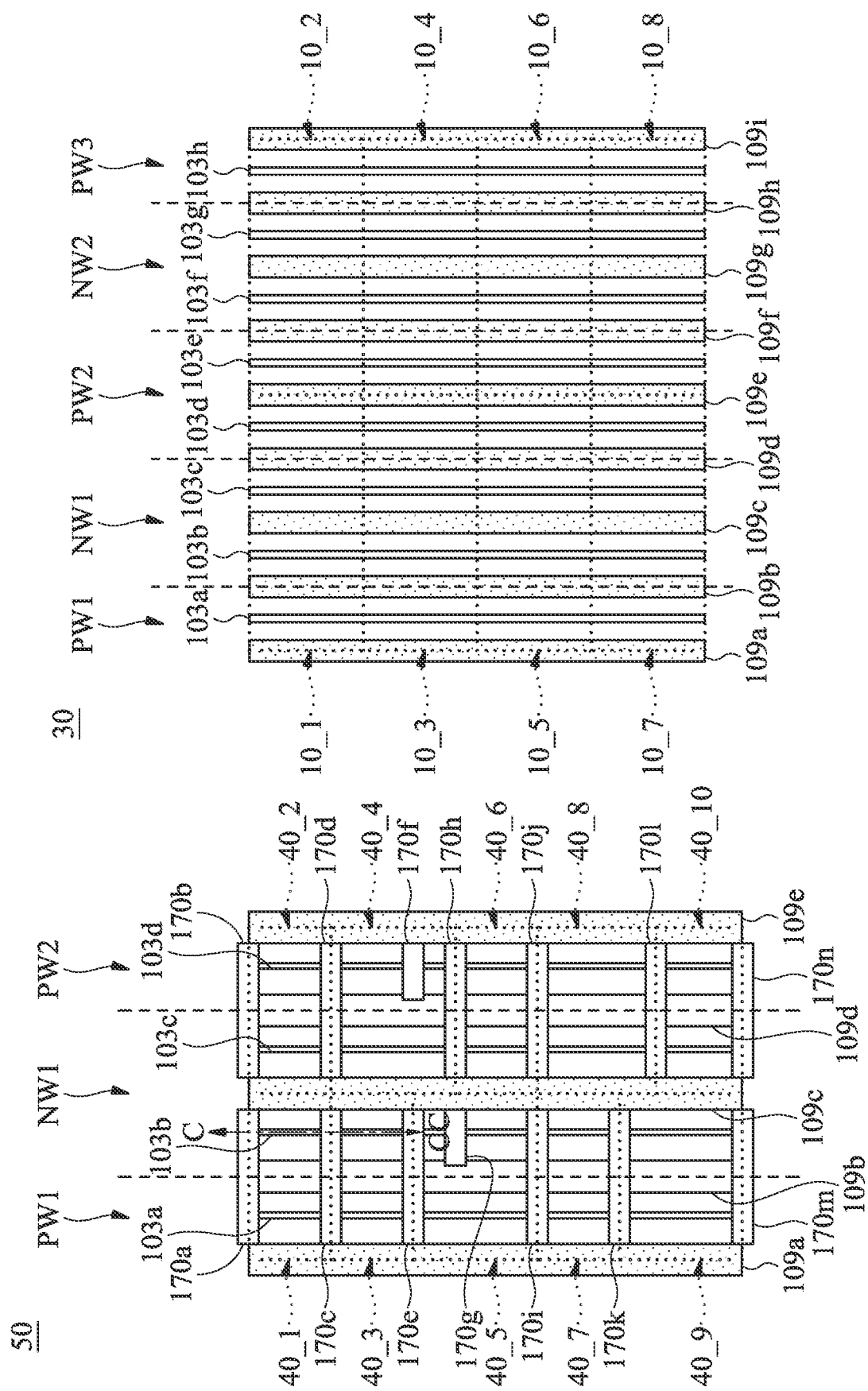
FIG. 8 illustrates a layout of an IC, in accordance with some embodiments of the disclosure.

FIG. 8 illustrates a layout of an IC, in accordance with some embodiments of the disclosure. The IC includes a logic cell array 50 and an SRAM 30, as shown in FIG. 8 in accordance with some embodiments. The SRAM 30 includes a plurality of SRAM cells 10_1, 10_2, 10_3, 10_4, 10_5, 10_6, 10_7 and 10_8 over P-type well regions PW1, PW2, and PW3, and over N-type well regions NW1 and NW2.

In some embodiments, the SRAM 30 also includes a plurality of fins 103a, 103b, 103c, 103d, 103e, 103f, 103g and 103h and a plurality of dielectric fins 109a, 109b, 109c, 109d, 109e, 109f, 109g, 109h and 109i. It should be noted that since the transistors of the SRAM 30 shown in FIG. 8 are single-fin transistors, adjacent pairs of the fins 103a to 103h are separated from each other by each of the corresponding dielectric fins 109a to 109i, in accordance with some embodiments. In some embodiments, some of the transistors (e.g., PMOS transistors) of the SRAM 30 have multiple-fins. The details of the SRAM 30 may be similar to the semiconductor structure 100 of FIG. 3, and are not repeated herein for simplicity.

Moreover, the logic cell array 50 includes a plurality of logic cells 40_1, 40_2, 40_3, 40_4, 40_5, 40_6, 40_7, 40_8, 40_9 and 40_10. In some embodiments, the logic cells 40_1 to 40_10 are standard cells (e.g., inverter (INV), AND, OR, NAND, NOR, Flip-Flop, SCAN, etc.), a combination thereof or specific functional cells. The logic functions of the logic cells 40_1 to 40_10 may be the same or different. For example, the logic cells 40_1 to 40_10 may be the standard cells corresponding to the same logic gates or different logic gates. Furthermore, each of the logic cells 40_1 to 40_10 may include a plurality of transistors. In some embodiments, the logic cells 40_1 to 40_10 corresponding to the same function or operation may have the same circuit configuration with different transistor sizes and different semiconductor structures.

In addition, the logic cells 40_1, 40_3, 40_5, 40_7 and 40_9 are arranged in the same column, and the logic cells 40_2, 40_4, 40_6, 40_8 and 40_10 are arranged in the same column. In the logic cells 40_1, 40_3, 40_5, 40_7 and 40_9, NMOS transistors are formed over a P-type well region PW1, and PMOS transistors are formed over an N-type well region NW1. In the logic cells 40_2, 40_4, 40_6, 40_8 and 40_10, PMOS transistors are formed over the N-type well region NW1, and NMOS transistors are formed over a P-type well region PW2.

The logic cell array 50 also includes a plurality of fins 103*a*, 103*b*, 103*c* and 103*d* and a plurality of dielectric fins 109*a*, 109*b*, 109*c*, 109*d* and 109*e*. Similar to the SRAM 30, adjacent pairs of the fins 103*a* to 103*d* are separated from each other by each of the corresponding dielectric fins 109*a* to 109*e*, in accordance with some embodiments.

In addition, the logic cell array 50 also includes a plurality of dielectric-base dummy gates 170*a*, 170*b*, 170*c*, 170*d*, 170*e*, 170*f*, 170*g*, 170*h*, 170*i*, 170*j*, 170*k*, 170*l*, 170*m* and 170*n* extend along the X-direction and disposed on boundaries of the logic cells 40_1 to 40_10, as shown in FIG. 8 in accordance with some embodiments. In some embodiments, the dielectric-base dummy gates 170*a* to 170*n* are used to isolate adjacent logic cells 40_1 to 40_10 along the Y-direction. For example, the logic cells 40_1 and 40_3 are isolated (or separated) from each other by the dielectric-base dummy gate 170*c*, and the logic cells 40_2 and 40_4 are isolated (or separated) from each other by the dielectric-base dummy gate 170*d*. The details of the dielectric-base dummy gates 170*a* to 170*n* will be described in detail below according to FIG. 9. It should be noted that the gate electrodes in the logic cell array 50 are not shown in FIG. 8.

In some embodiments, the dielectric fins 109*a* to 109*e* of the logic cell array 50 and the dielectric fins 109*a* to 109*i* of the SRAM 30 have widths along the X-direction, and the widths of the dielectric fins 109*a* to 109*e* of the logic cell array 50 are greater than the widths of the dielectric fins 109*a* to 109*i* of the SRAM 30. In some embodiments, the ratios of the widths of the dielectric fins 109*a* through 109*e* of the logic cell array 50 to the widths of the dielectric fins 109*a* through 109*i* of the SRAM 30 are greater than about 1.2.

Figure 9:
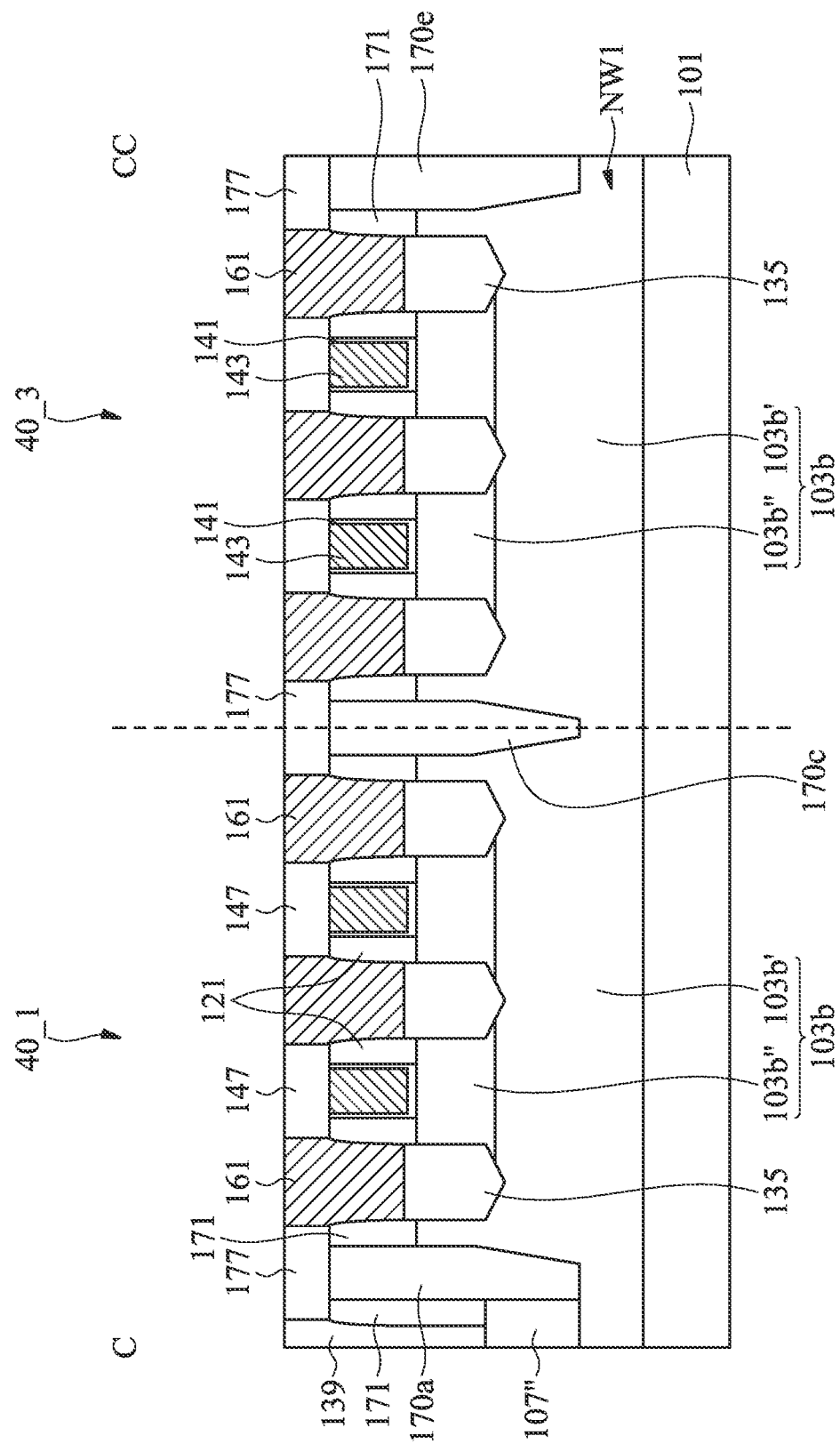
FIG. 9 illustrates a cross-sectional view of the logic cell array along line C-CC in FIG. 8, in accordance with some embodiments of the disclosure.

FIG. 9 illustrates a cross-sectional view of the logic cell array 50 along line C-CC in FIG. 8, in accordance with some embodiments of the disclosure. A plurality of PMOS transistors are formed over the N-type well region NW1, as shown in FIG. 9 in accordance with some embodiments.

It should be noted that the fins 103*b* and 103*c* serve as the channel regions of the PMOS transistors of the logic cells in the logic cell array 50. For example, the fin 103*b* serves as the channel regions of the PMOS transistors of the logic cells 40_1 and 40_3 as shown in FIG. 9. In some embodiments, each of the fins 103*b* and 103*c* includes an upper portion and a lower portion under the upper portion. For example, the fin 103*b* includes an upper portion 103*b*" and a lower portion 103*b*' as shown in FIG. 9. More specifically, in some embodiments, the upper portions of the fins of the PMOS transistors in the logic cell array 50 is made of SiGe, the lower portion of the fin of the PMOS transistors in the logic cell array 50 are made of Si, and the fins of the PMOS transistors in the SRAM 30 are entirely made of Si to reduce leakage current.

Moreover, the dielectric-base dummy gates 170*a*, 170*c* and 170*e* extend into the fin 103*b*, hard mask 177 is formed over the dielectric-base dummy gates 170*a*, 170*c* and 170*e*, and spacers 171 are formed over opposite sidewalls of the dielectric-base dummy gates 170*a*, 170*c* and 170*e*, as shown in FIG. 9 in accordance with some embodiments. Some materials used to form the hard mask 177 and the spacers 171 may be similar to, or the same as, those used to form the hard mask 147 and the gate spacers 121 described previously and are not repeated herein.

In addition, the details of the gate dielectric layer 141, the hard mask 147, the gate spacers 121, the S/D structures 135, the insulating liner 107" and the ILD layer 139 may be similar to the semiconductor structure 100 of FIGS. 4J, 5A and 5B, and are not repeated herein for simplicity. Some materials used to form the gate electrode 143 and the contacts 161 may be similar to, or the same as, those used to form the gate electrodes 143*a* to 143*d* and the contacts 161*a* to 161*h* described previously in FIGS. 4J, 5A and 5B and are not repeated herein.

Embodiments of a semiconductor structure and methods for forming the same are provided. The semiconductor structure includes first and second P-type well regions, an N-type well region and an SRAM cell over a substrate. The N-type well region is between the first and the second P-type well regions. The SRAM cell includes first and second pull-up transistors over the N-type well region, a first pull-down transistor over the second P-type well region, and a second pull-down transistor over the first P-type well region. The first pull-up transistor, the second pull-up transistor, the first pull-down transistor and the second pull-down transistor respectively includes a first fin, a second fin, a third fin and a fourth fin. The semiconductor structure also includes a first dielectric fin between the second and the fourth fins, a second dielectric fin between the first and the second fins, and a third dielectric fin between the first and the third fins. By disposing the dielectric fins (i.e., dummy fins) between adjacent fins (i.e., active fins), the undesirable bridge problem between S/D structures can be prevented while the sizes of the S/D structures reach their maximum values. As a result, the contact resistance between the S/D structures and the contacts overlying the S/D structures may be reduced, and the performance and the operation speeds of the semiconductor structure of the SRAM cell may be enhanced.

Moreover, the SRAM cell of the semiconductor structure has continuous fins across the entire SRAM cell, which are used to form continuous dielectric fins across the entire SRAM cell, or even across and shared by the adjacent SRAM cells. Thus, the shrinkage that usually happens at the ends of the fins may be reduced, it may become easier to align the fins, and the process of forming the fins may become easier because there are fewer patterning steps.

Furthermore, compared to discontinuous fins (e.g., discontinuous fins of the pull-up transistors), the continuous fins of the embodiments of the disclosure have lower well resistance (e.g., N-type well region resistance), which can achieve a better soft error rate (SER) and provide a better latch up prevention, it is advantageous for saving the cell array area.

In some embodiments, a semiconductor structure is provided. The semiconductor structure includes a first dielectric fin, a first semiconductor fin and a second dielectric fin over a substrate. The first semiconductor fin interposes between and is spaced apart from the first dielectric fin and the second dielectric fin. The semiconductor structure also includes a first source/drain structure over a source/drain portion of the first semiconductor fin, an inter-layer dielectric layer covering a first portion of an upper surface of the first source/drain structure and an upper surface of the second dielectric fin, and a first contact in the inter-layer dielectric layer and covering a second portion of the upper surface of the first source/drain structure and an upper surface of the first dielectric fin.

In some embodiments, a semiconductor structure is provided. The semiconductor structure includes a pull-up transistor over a substrate, and the pull-up transistor includes a first channel region of a first semiconductor fin and a first source/drain structure over the first semiconductor fin. The semiconductor structure also includes a pull-down transistor adjacent to the pull-up transistor, and the pull-down transistor includes a first channel region of a second semiconductor fin and a second source/drain structure over the second semiconductor fin. The semiconductor structure includes an insulating liner between the first semiconductor fin and the second semiconductor fin, and a dielectric fin interposing the first source/drain structure and the second source/drain structure and including a bottom portion embedded in the insulating liner.

In some embodiments, a method for forming a semiconductor structure is provided. The method includes forming a first semiconductor fin and a second semiconductor fin over a substrate, forming an insulating material over the first semiconductor fin and the second semiconductor fin, forming a dielectric layer over the insulating material and filling a gap between the first semiconductor fin and the second semiconductor fin, and polishing the dielectric layer and the insulating material until the first semiconductor fin and the second semiconductor fin are exposed. A remaining portion of the dielectric layer forms a dielectric fin. The method also includes recessing the insulating material to expose sidewalls of the dielectric fin, forming a dummy gate structure across the first semiconductor fin, the dielectric fin and the second semiconductor fin, and forming a first source/drain structure over the first semiconductor fin and a second source/drain structure over the second semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first dielectric fin, a first semiconductor fin and a second dielectric fin over a substrate, wherein the first semiconductor fin interposes between and is spaced apart from the first dielectric fin and the second dielectric fin;
   a first source/drain structure over a source/drain portion of the first semiconductor fin;
   an inter-layer dielectric layer covering a first portion of an upper surface of the first source/drain structure and an upper surface of the second dielectric fin; and
   a first contact in the inter-layer dielectric layer and covering a second portion of the upper surface of the first source/drain structure and an upper surface of the first dielectric fin.

2. The semiconductor structure as claimed in claim 1, wherein a bottom surface of the first source/drain structure is located lower than the upper surface of the first dielectric fin and higher than a bottom surface of the first dielectric fin.

3. The semiconductor structure as claimed in claim 1, further comprising:
   a first insulating liner separating the first dielectric fin from the first semiconductor fin; and
   a second insulating liner separating the second dielectric fin from the first semiconductor fin.

4. The semiconductor structure as claimed in claim 3, wherein a bottom surface of the first source/drain structure is located lower than an upper surface of the first insulating liner.

5. The semiconductor structure as claimed in claim 1, wherein the first source/drain structure is in contact with both the first dielectric fin and the second dielectric fin.

6. The semiconductor structure as claimed in claim 1, further comprising:
   a gate-cut structure over the first dielectric fin; and
   a gate electrode in contact with the gate-cut structure and continuously extending across a channel region of the first semiconductor fin and the second dielectric fin.

7. The semiconductor structure as claimed in claim 1, further comprising:
   a second semiconductor fin and a third dielectric fin over the substrate, wherein the second semiconductor fin is between the second dielectric fin and the third dielectric fin;
   a second source/drain structure over a source/drain portion of the second semiconductor fin, wherein the inter-layer dielectric layer covers a first portion of an upper surface of the second source/drain structure; and
   a second contact in the inter-layer dielectric layer and covering a second portion of the upper surface of the second source/drain structure and an upper surface of the third dielectric fin.

8. The semiconductor structure as claimed in claim 7, further comprising:
   a first well region and a second well region over the substrate, wherein the first semiconductor fin is formed on the first well region, the second semiconductor fin is formed on the second well region, and the first well region and the second well region have different conductive types.

9. The semiconductor structure as claimed in claim 8, wherein the second dielectric fin overlaps an interface between the first well region and the second well region.

10. A semiconductor structure, comprising:
a pull-up transistor over a substrate, the pull-up transistor comprising a first channel region of a first semiconductor fin and a first source/drain structure over the first semiconductor fin;
a pull-down transistor adjacent to the pull-up transistor, the pull-down transistor comprising a first channel region of a second semiconductor fin and a second source/drain structure over the second semiconductor fin;
an insulating liner between the first semiconductor fin and the second semiconductor fin; and
a dielectric fin interposing the first source/drain structure and the second source/drain structure and including a bottom potion embedded in the insulating liner.

11. The semiconductor structure as claimed in claim 10, wherein the dielectric fin is in contact with both the first source/drain structure and the second source/drain structure.

12. The semiconductor structure as claimed in claim 10, further comprising:
a contact electrically connected to both the first source/drain structure and the second source/drain structure.

13. The semiconductor structure as claimed in claim 12, wherein the contact covers an upper surface of the dielectric fin.

14. The semiconductor structure as claimed in claim 10, wherein the pull-up transistor and the pull-down transistor share a same gate electrode, and the gate electrode surrounds the first channel region of the first semiconductor fin and the first channel region of the second semiconductor fin.

15. The semiconductor structure as claimed in claim 10, wherein the pull-up transistor is formed over an N-type well region, and the pull-down transistor is formed over a P-type well region.

16. The semiconductor structure as claimed in claim 10, further comprising:
an isolation transistor over the substrate, the isolation transistor comprising a second channel region of the first semiconductor fin and a first gate electrode surrounding the second channel region of the first semiconductor fin; and
a pass-gate transistor adjacent to the isolation transistor, the pass-gate transistor comprising a second channel region of the second semiconductor fin and a second gate electrode surrounding the second channel region of the second semiconductor fin, wherein the dielectric fin interposes between the first gate electrode and the second gate electrode.

17. A method for forming a semiconductor structure, comprising:
forming a first semiconductor fin and a second semiconductor fin over a substrate;
forming an insulating material over the first semiconductor fin and the second semiconductor fin;
forming a dielectric layer over the insulating material and filling a gap between the first semiconductor fin and the second semiconductor fin;
polishing the dielectric layer and the insulating material until the first semiconductor fin and the second semiconductor fin are exposed, wherein a remaining portion of the dielectric layer forms a dielectric fin;
recessing the insulating material to expose sidewalls of the dielectric fin;
forming a dummy gate structure across the first semiconductor fin, the dielectric fin and the second semiconductor fin; and
forming a first source/drain structure over the first semiconductor fin and a second source/drain structure over the second semiconductor fin.

18. The method for forming the semiconductor structure as claimed in claim 17, wherein the first source/drain structure is formed until the first source/drain structure is in contact with the dielectric fin, and the second source/drain structure is formed until the second source/drain structure is in contact with the dielectric fin.

19. The method for forming the semiconductor structure as claimed in claim 17, further comprising:
forming an inter-layer dielectric layer over the first source/drain structure and the second source/drain structure; and
forming a contact through the inter-layer dielectric layer and on the first source/drain structure, the dielectric fin and the second source/drain structure.

20. The method for forming the semiconductor structure as claimed in claim 17, further comprising:
removing the dummy gate structure;
forming a gate electrode across the first semiconductor fin, the dielectric fin and the second semiconductor fin; and
forming a dielectric structure through the gate electrode and on the dielectric fin.

* * * * *